(12) United States Patent
Sugiura et al.

(10) Patent No.: US 6,177,635 B1
(45) Date of Patent: Jan. 23, 2001

(54) WIRING SUBSTRATE AND MANUFACTURING METHOD THEREOF

(75) Inventors: Masuo Sugiura; Hiroshi Watanabe; Mitsuji Kubota, all of Shizuoka (JP)

(73) Assignee: Yazaki Corporation, Tokyo (JP)

( * ) Notice: Under 35 U.S.C. 154(b), the term of this patent shall be extended for 0 days.

(21) Appl. No.: 09/461,276

(22) Filed: Dec. 14, 1999

(30) Foreign Application Priority Data

Jan. 12, 1999 (JP) .................................................. 11-005315
Jan. 12, 1999 (JP) .................................................. 11-005316

(51) Int. Cl.[7] .............................. H01B 17/00; H05K 7/02
(52) U.S. Cl. ..................... 174/138 G; 361/807; 361/808; 361/809; 361/810; 361/742
(58) Field of Search .................. 219/121.63; 174/138 G; 361/807, 808, 809, 810, 742

(56) References Cited

U.S. PATENT DOCUMENTS 5,009,615 * 4/1991 Mobley et al. ...................... 439/595
6,095,855 * 8/2000 Iwata et al. ........................... 439/553

* cited by examiner

Primary Examiner—Cathy Lam

(74) Attorney, Agent, or Firm—Armstrong, Westerman, Hattori, McLeland & Naughton

(57) ABSTRACT

A coating insulator layer has plural rows of through holes disposed longitudinally in the coating insulator layer. A plurality of conductors are disposed in parallel with one another longitudinally in the coating insulator layer. Each conductor does not interfere with the through holes. Plural rows of locking projections are longitudinally formed on a face of the coating insulator layer. The locking projection has a construction to engage with the through hole. Thus, when a couple of the wiring substrates are layered, some of the locking projections formed on one of the wiring substrates are aligned to be engaged with some relative through holes of the other wiring substrate, allowing a sure lamination of the wiring substrates. The locking projections are disposed in regular intervals and the through holes are spaced in the same regular intervals. Another wiring substrate is enough flexible to be arranged along a structural wall for wiring. The wiring substrate has a stiffener means disposed in the insulator layer. The stiffener means is positioned not to interfere with the conductors and provides enough stiffness to keep the wiring substrate in a desired shape. The stiffener means has a larger strength than the insulator layer in bending strength and the stiffener means is disposed parallel with the longitudinal direction of the conductors. The wiring substrate has a plurality of through holes which each can be engageable with a locking projection provided on the structural wall.

21 Claims, 22 Drawing Sheets

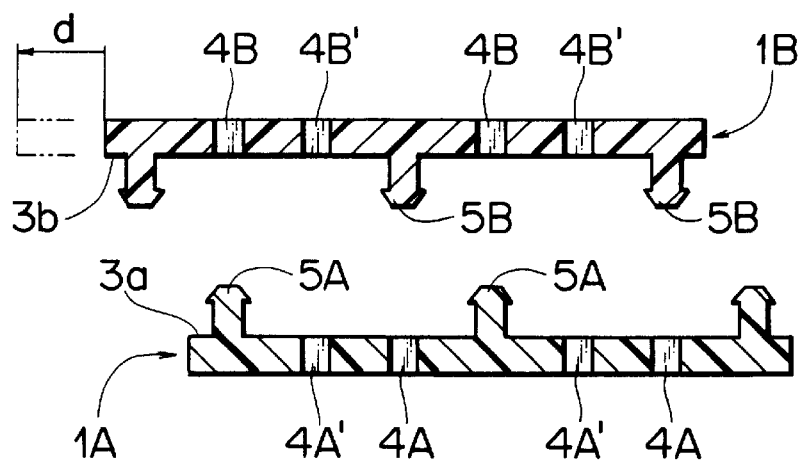
F I G. 4 A
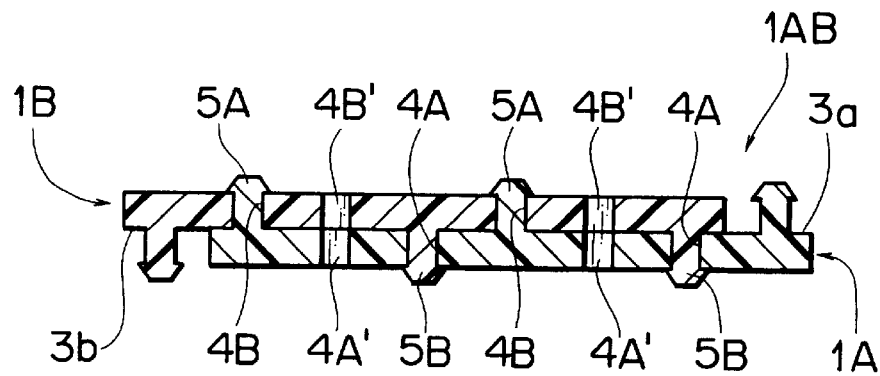
F I G. 4 B

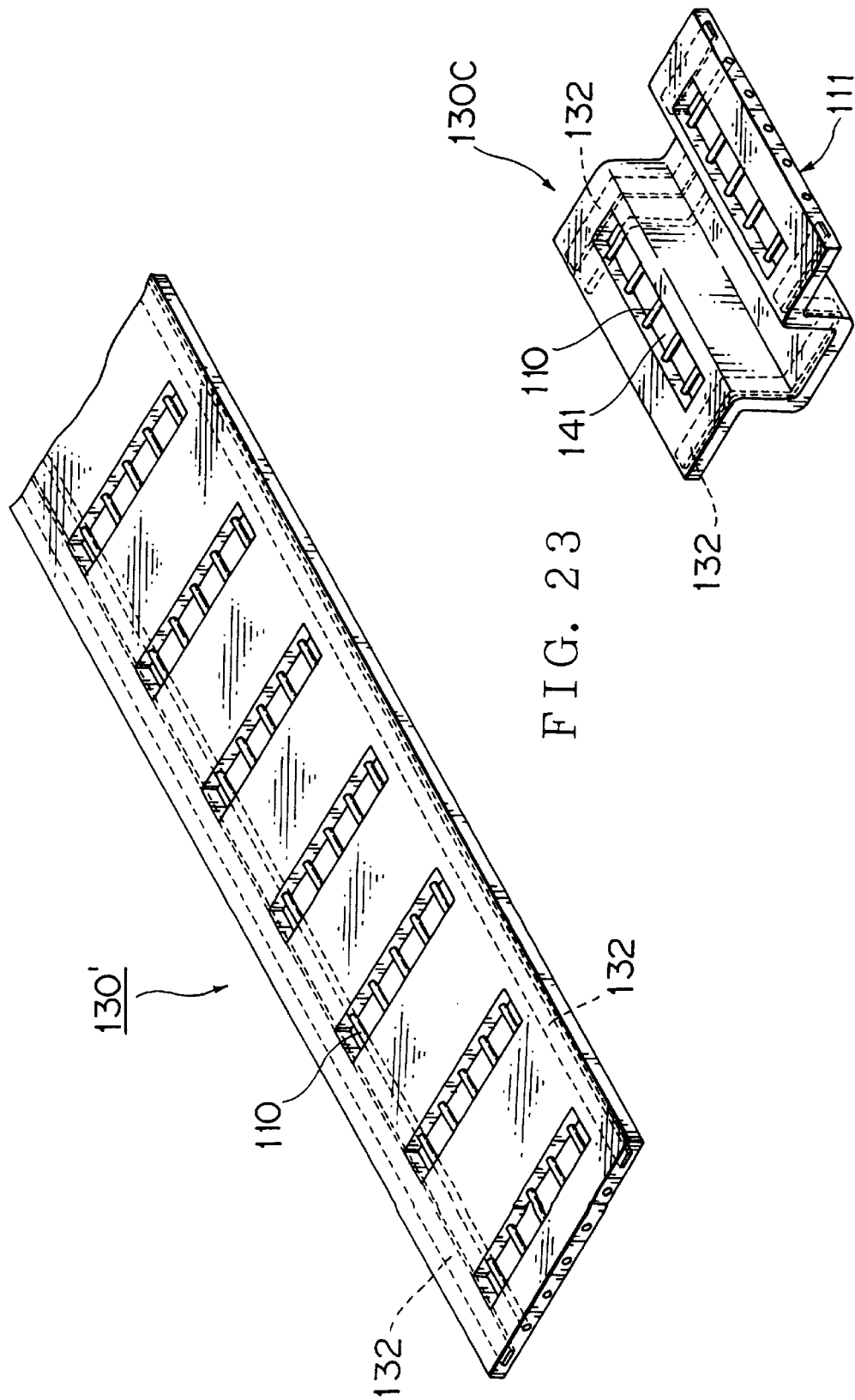

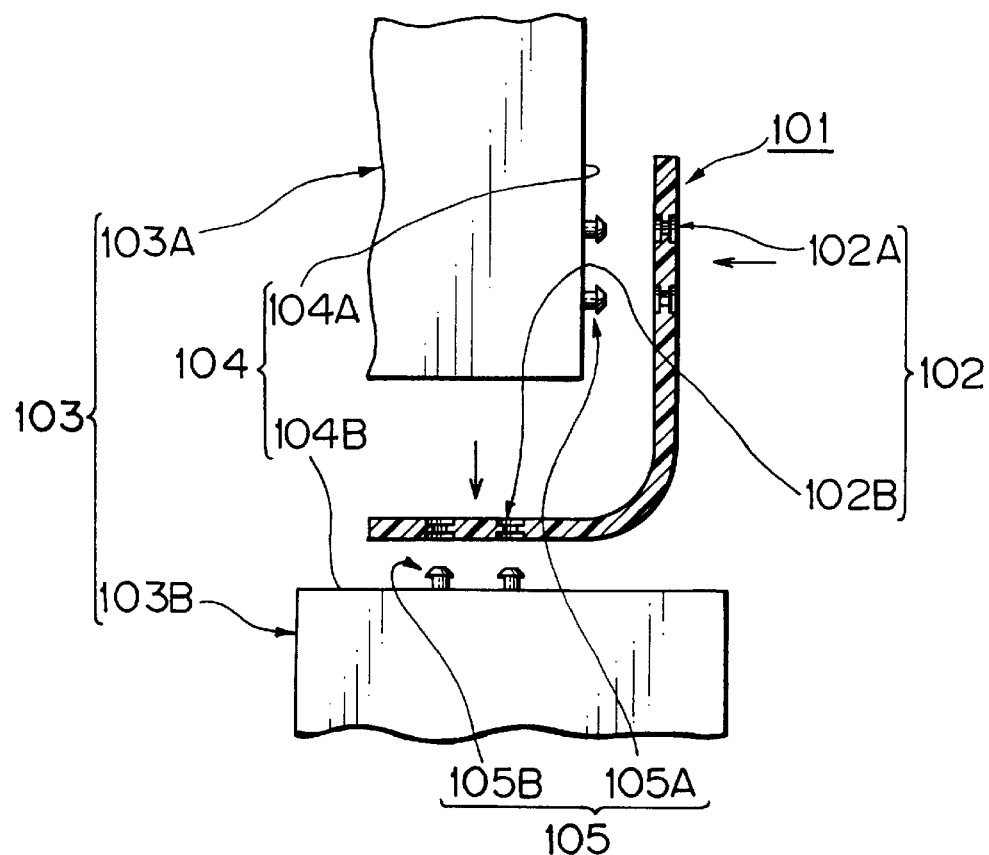
F I G. 28
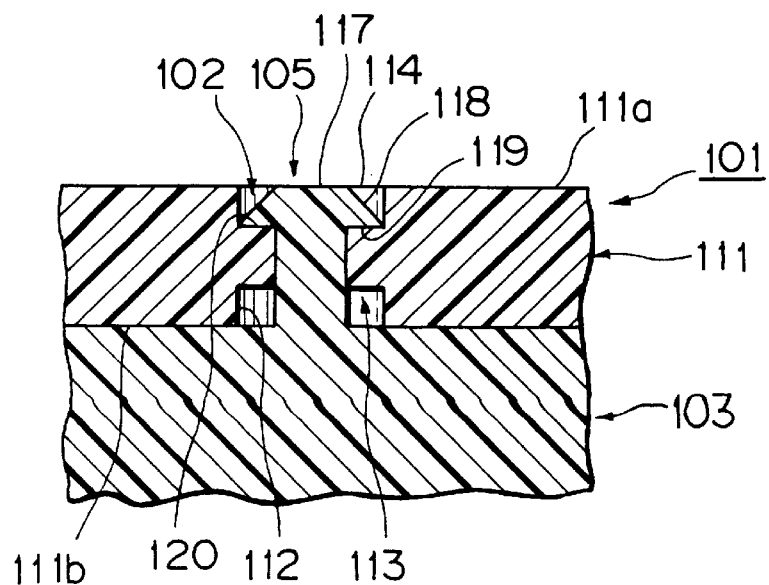
F I G. 33

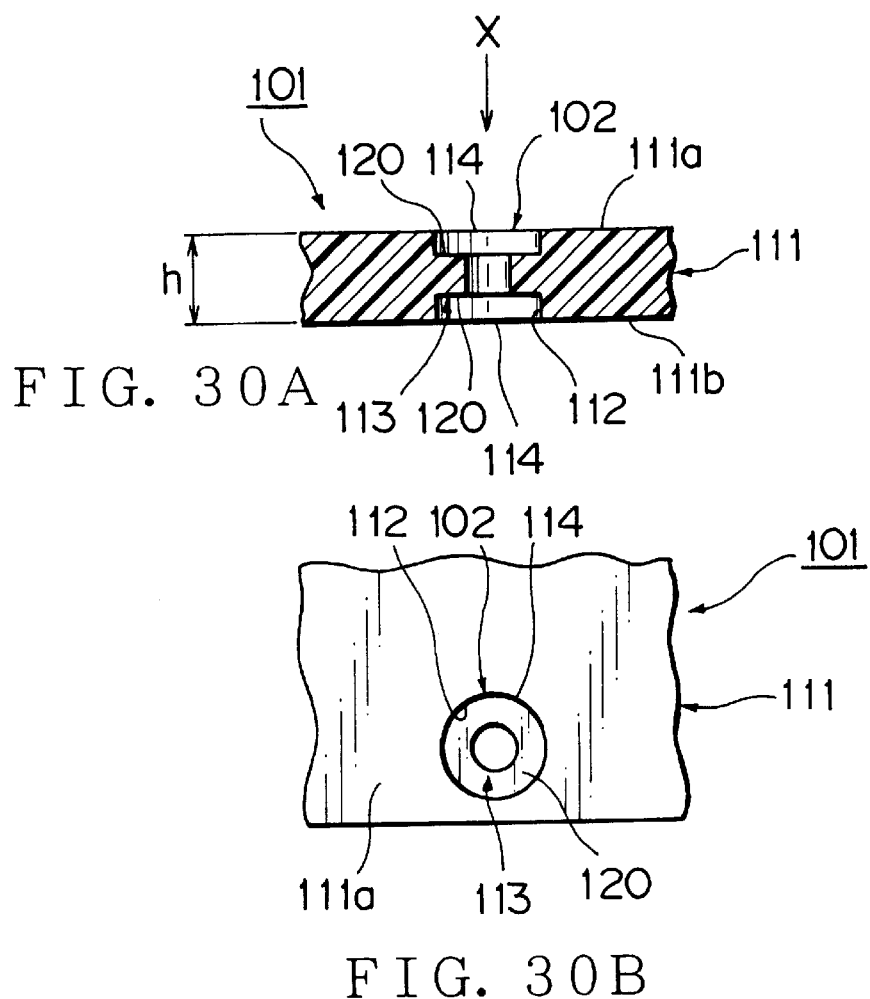
FIG. 30A
FIG. 30B
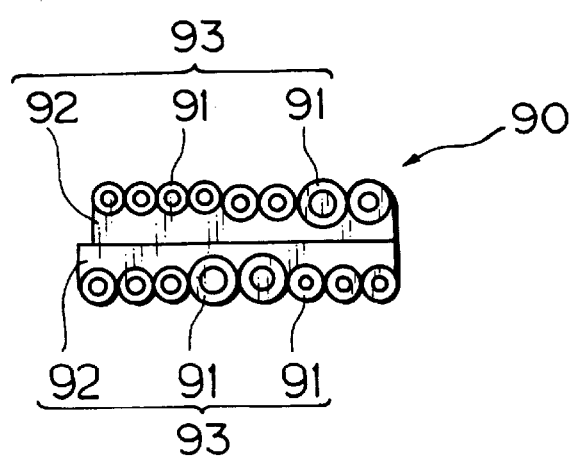
PRIOR ART
FIG. 34

WIRING SUBSTRATE AND MANUFACTURING METHOD THEREOF

BACKGROUND OF THE INVENTION

1. Field of the Invention

This invention relates to a wiring substrate having a plurality of conductors therein, a manufacturing process of the substrate, a layered assembly of a plurality of the wiring substrates, and a structure for securing the substrate, for example to a vehicle body.

2. Prior Art

FIG. 34 shows a conventional wire harness substrate 90 used in an automobile vehicle, which is disclosed in Japanese patent application laid-open No. H. 3-8214.

The wire harness substrate 90 has two flat wire harnesses 93 each of which includes a synthetic resin layer 92 and a plurality of parallel disposed electrical wires 91 integrally assembled with the synthetic resin layer 92. The two flat wire harnesses 93 are bonded together at their flat faces of the synthetic resin layers 92 by welding or with an adhesive to constitute the wire harness substrate 90.

However, a wiring pattern of the electrical wires 91 is limited in a specified application. Moreover, a plurality of flat wire harnesses 93 can not be easily layered to provide an appropriate positioning relation among the layered wire harnesses 93. In addition, different grades of automobile vehicles (not shown) which require different wiring patterns of wire harnesses 90 each need a specified forming mold (not shown), limiting variation of the wiring patterns in design and assembling of wiring harnesses.

Furthermore, on securing the wire harness substrate 90 to a vehicle body, some other securing members (not shown) such as clips and screws are necessary, or an adhesive is used for the mounting of the wire harness substrate 90. Therefore, a more efficient securing method of the wire harness substrate 90 has been desired. In addition, different grades of automobile vehicles (not shown) require different wiring patterns of wire harnesses 90, which needs specified forming molds (not shown) and limits variations of wiring patterns in design and assembling of wiring harnesses.

SUMMARY OF THE INVENTION

In view of the above-mentioned disadvantages of the conventional wire harness substrate, an object of the present invention is to provide a wiring substrate, a manufacturing process of the substrate, and a layered assembly of a plurality of the substrates, in which conductors other than electrical wires may be applied. Furthermore, the wiring substrates according to the present invention can be easily layered with an appropriate positioning relation among the layered wire and can be utilized freely in different wiring patterns.

Another object of the present invention is to provide a wiring substrate, a manufacturing process of the wiring substrate, and a structure for securing the substrate. The substrate is able to be secured easily, for example to a vehicle body.

For achieving the objects, various aspects and advantageous effects of the invention will be discussed hereinafter.

In a first aspect of a wiring substrate according to the present invention, a coating insulator layer has a plurality of conductors disposed in parallel with one another in the longitudinal direction of the layer. Plural rows of through holes are disposed longitudinally in the coating insulator layer. Each through hole does not interfere with the conductors. Plural rows of locking projections are longitudinally formed on a face of the coating insulator layer. The locking projections are spaced from one another equally to the space of the rows of the through holes. The locking projection has a construction to engage with the through hole.

Thus, when a couple of the wiring substrates are layered, some of the locking projections formed on one of the wiring substrates are aligned to be engaged with some relative through holes of the other wiring substrate, allowing a sure lamination of the wiring substrates.

In a second additional aspect of the present invention, one row of the through holes are in line with one row of the locking projections. Thus, the locking projections formed on one of the wiring substrates are easily aligned to engage with the relative through holes of another wiring substrate, allowing a simplified lamination of the wiring substrates.

In a third additional aspect of the present invention, the one row of through holes and the one row of locking projections are disposed in each outer side of the conductors. The through holes and locking projections in one side of the insulator layer are positioned in a symmetrical relation with the other. Thereby, two of the wiring substrates will be secured at both the longitudinal sides of the wiring substrate in parallel with the conductors when layered.

In a fourth additional aspect of the present invention, the locking projections are disposed at regular intervals and each row of through holes is disposed between adjacent two of the locking projections. Thereby, the locking projections formed on one of the wiring substrates are easily aligned to be engaged with the relative through holes of another wiring substrate, allowing a simplified lamination of the wiring substrates. Furthermore, more than two wiring substrates can be easily layered by providing a plurality of the through holes between the locking projections, because a top substrate of multilayered wiring substrate assemblies always has unused one of the through holes.

In a fifth additional aspect of the present invention, the rows of through holes are disposed at regular intervals and each of the locking projections is disposed between of the rows of through holes. That is, the through hole and the locking projection are alternately positioned.

In a sixth additional aspect of the present invention, the coating insulator layer has at least one connection portion for connecting the conductors to an external circuit. The wiring substrate having the connection portion is suitable for general purpose use.

In a seventh additional aspect of the present invention, the connection portion is a recess formed in one face of the coating insulator layer. The recess having a depth which does not expose the conductor with a thin insulation distance from the conductor is advantageous for connecting a press-contacting terminal which presses into the thin insulating part to make press-contact with the conductor. This enables an easy connection of the external circuit to the conductor within the connection portion. In addition, the connection portion which is not used for electrical connection keeps an insulating layer so that the conductor is not exposed within the connection portion, preventing a short circuit of the conductor.

In an eighth additional aspect of the present invention, the connection portion is formed so as to expose the conductors from the coating insulator layer. Thereby, an external circuit is directly connected to the conductor disposed in the wiring substrate, allowing an easy electrical connection of the external circuit to the wiring substrate.

In a ninth additional aspect of the present invention, the connection portion is elongated in a direction intersecting the longitudinal direction of the conductors. When a plurality of conductors are exposed in the connection portion, a suitable one of the conductors within the connection portion will be selected to be connected to an external circuit. This enables an easier electrical connection of the external circuit to the conductors disposed in the wiring substrate.

In a tenth additional aspect of the present invention, the coating insulator layer has a plurality of the connection portions disposed in the lateral direction of the conductors for every other one of the conductors. When one wiring substrate is overlaid by another wiring substrate, the connection portions of each wiring substrate can be shifted from the connection portions of the another wiring substrate so that each connection portion abuts against an insulated surface of the opposing wiring substrate. This prevents current leakage due to moisture condensation between the conductors disposed in the wiring substrate.

In an eleventh additional aspect of the present invention, the coating insulator layer has a thickness equal to the height of the locking projection. Thereby, for example, a two-layered wiring substrate assembly having a couple of wiring substrates has locking projections which are engaged with the associated through holes such that the top and bottom surfaces of the two-layered wiring substrate assembly are flat. Thus, when the two-layered wiring substrate assembly is mounted on a panel wall of an automobile vehicle, the engaged locking projections provide no disadvantage of interference with the panel wall.

In a twelfth additional aspect of the present invention, the coating insulator layer is made of an elastomer material and the conductors are integrally inserted in the coating insulator layer. Since the elastomer material is made of an elastic polymer, the wiring substrate can be modified in shape to comply with various types of wiring patterns, enabling greater flexibility in design of wiring patterns.

In a thirteenth additional aspect of the present invention, a manufacturing process of the wiring substrate set forth in the first aspect of the invention comprises the steps of forming a long length of the coating insulator layer with the conductors, and cutting the long length into a plurality of the wiring substrates. Thereby, only the provision of a forming mold for forming the long length of the wiring substrate allows to efficiently produce any length of such wiring substrate. Meanwhile, in a conventional art, plural types of forming molds have been necessary. The long length of wiring substrate is suitable for producing a number of wiring substrates continuously, increasing the productivity of the wiring substrates. Change of the cutting length may produce wiring substrates having a different length, enabling greater flexibility in design of wiring patterns.

In a fourteenth additional aspect of the present invention, a plurality of the wiring substrates can be layered such that at least one through hole of one wiring substrate engages with one locking projection of another wiring substrate adjacent to the one wiring substrate. Thereby, a multi-layered wiring substrate assembly is easily assembled without using another constitution member, increasing the productivity of the wiring substrate assembly.

In a fifteenth aspect of the invention, a wiring substrate includes an insulator layer and a plurality of parallel conductors disposed in the insulator layer. The wiring substrate is enough flexible to be arranged along at least two walls which are in an intersection relation with one another. Thereby, the wiring substrate can be easily modified in shape to comply with a plurality of the differently oriented panel walls. In addition, the wiring substrate decreases the number of forming molds, which also decreases a producing cost for completing the electrical wiring thereof as compared with a conventional method which requires multi-types of forming molds to produce multi wiring substrates so as to comply with walls having various shapes.

In a sixteenth aspect of the invention, a wiring substrate includes an insulator layer, a plurality of parallel conductors disposed in the insulator layer, and a stiffener means disposed in the insulator layer. The stiffener is positioned not to interfere with the conductors and provides enough stiffness to keep the wiring substrate in a desired shape. Thereby, the reinforcing means protects the conductors from undesirable deformation during and after the forming of the wiring substrate.

In a seventeenth additional aspect of the invention, the stiffener means has a larger bending strength than the insulator layer and the stiffener means is disposed in parallel with the longitudinal direction of the conductors. Thereby, the reinforcing member prevents the deformation of the conductors and the insulator layer after the forming of the wiring substrate, improving the wiring substrate in quality.

In an eighteenth additional aspect of the invention, the stiffener means is positioned each outside of the conductors. Thereby, the reinforcing means surely protect the conductors positioned therebetween, further improving the wiring substrate in quality.

In a nineteenth additional aspect of the invention, the insulator layer is made of an elastomer in which the conductors are inserted. Thereby, the wiring substrate is resiliently modified in shape.

In a twentieth aspect of the invention, a process for press-forming the wiring substrate includes that a part of the wiring substrate is pressed to modify the wiring substrate in shape along the pressed part. The press-forming enables to produce any desirably shaped wiring substrates by changing press molds. This decreases the number of different forming molds as compared with a conventional process. The process can provide a number of differently shaped final wiring substrates with a reduced producing cost. In addition, the standard wiring substrate can be formed so as to comply with a desired wiring pattern with an easier work than when a resin material is molded to combine electrical wires specifically for each desired wiring pattern, improving the wiring substrate in quality and in workability of production thereof.

In a twenty-first additional aspect of the invention, the wiring substrate has a plurality of through holes each of which can be engageable with a locking projection provided on a wall of another structure. This enables the wiring substrate to be easily secured to the wall of the structure. Thereby, differing from the prior art, the arrangement of the locking projections and the through holes requires neither other fixing members nor a welding means on mounting the wiring substrate on the wall of the structure, which minimizes the number of parts for the mounting of the wiring substrate. This enables an easy mounting work of the wiring substrate with an improved workability thereof.

In a twenty-second additional aspect of the invention, the through holes are equally spaced from one another. Thereby, the arrangement of the locking projections is easily designed according to the distance between the through holes.

In a twenty-third additional aspect of the invention, the through hole has at least one lock portion to lock with one of the locking projection. There may be provided a couple of lock portions for locking the locking projection which is inserted from either side of the wiring substrate. Thus, either side of the wiring substrate can face the opposing panel, which is advantageous for mounting the wiring substrate.

BRIEF DESCRIPTION OF THE DRAWINGS

FIG. 4A is a view in which the second wiring substrate is horizontally shifted in the left by a distance d from the state shown in FIG. 3, and FIG. 4B is a view in which the first and second wiring substrates have been coupled with one another in which the locking projections are engaged with the relative through holes;

FIG. 23 is a perspective view a long wiring substrate;

FIG. 26 is a perspective view showing another wiring substrate which has been formed by the press device of FIG. 24;

FIG. 28 is a sectional view illustration a fitting structure for a wiring substrate according to the present invention;

FIGS. 30A, 30B are respectively a sectional view or a plan view showing a through hole of FIG. 29;

FIG. 33 is an enlarged sectional view of FIG. 32, in which a locking projection has engaged with a through hole; and FIG. 34 is a sectional view showing a wire harness of a prior art.

DETAILED DESCRIPTION OF THE PREFERRED EMBODIMENTS

Referring to accompanied drawings, embodiments of the present invention will be discussed hereinafter.

Figure 1:
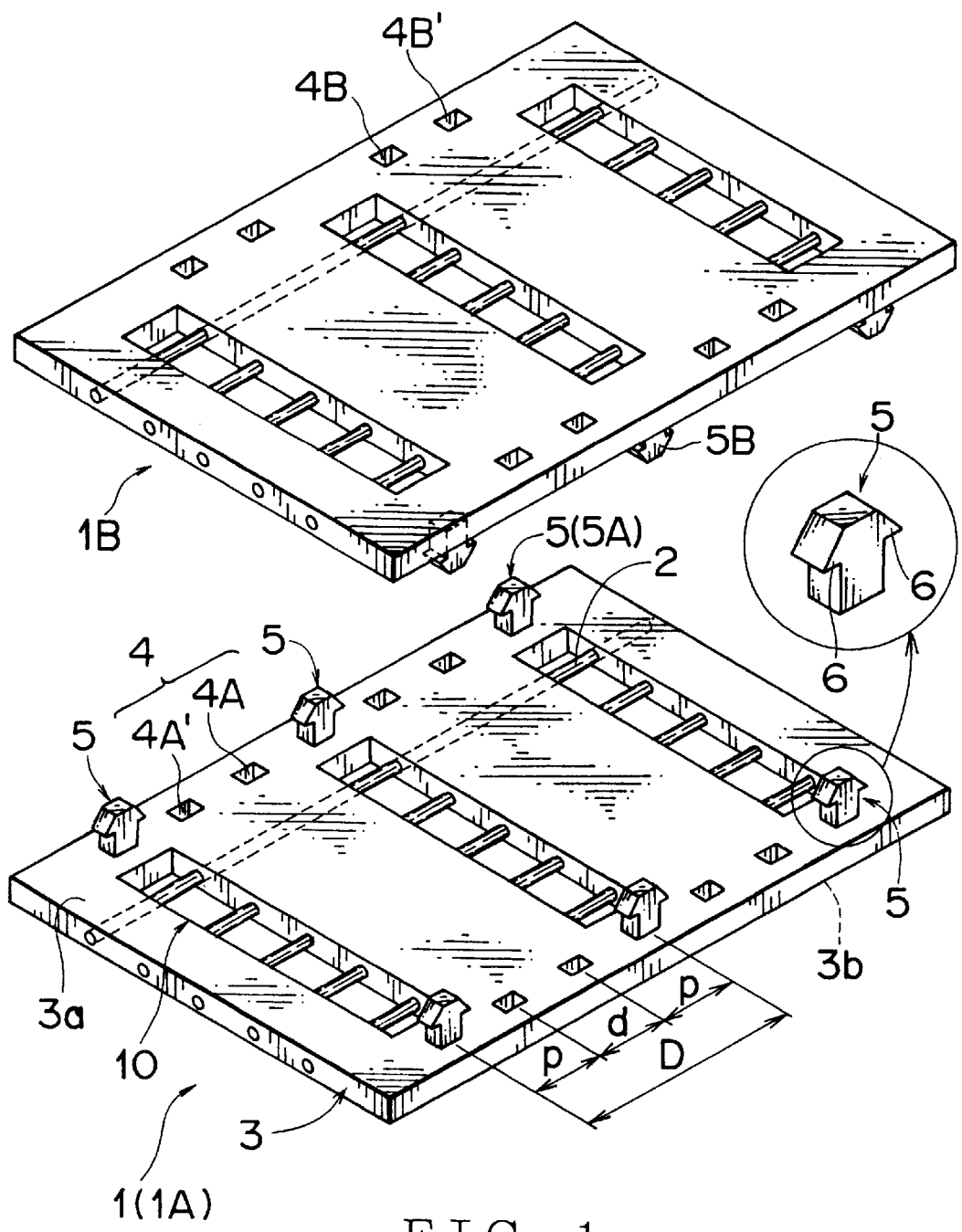
FIG. 1 is a perspective view showing a first embodiment of a wiring substrate according to the present invention.

FIGS. 1 to 9 show a first embodiment of a wiring substrate according to the present invention. As illustrated in FIG. 1, a wiring substrate 1 has a plurality of electrical wires 2 (corresponding to the conductors described in the summary of the invention), a coating insulator layer 3 for covering the wires, a plurality through holes 4 formed in the insulator layer 3, and a plurality of locking projections 5 formed on an upper face 3a of the insulator layer 3. The numeral 1 denotes generally a wiring substrate described in the embodiments while the numerals 1A, 1B, 1C, and so on each denote a wiring substrate associated with a specified example of the wiring substrate 1. Components of each wiring substrate will have numerals given according to the same way as the wiring substrate 1.

The plurality of electrical wires 2 are disposed in parallel with one another. The electrical wires 2 may be replaced by a plurality of busbars made of an electrically conductive material containing copper or aluminum. The insulator layer 3 is molded from a synthetic resin so as to integrally cover the electrical wires 2, or the insulator layer 3 may be formed by disposing (or sandwiching) the electrical wires 2 between a pair of insulating films (not shown). The synthetic resin is polypropylene, an elastomer (an elastic polymer), or the like. The wiring substrate 1 made of an elastomer is flexible to be modified in shape easily. The elastomer may be, for example, a natural rubber or a synthetic rubber, polyisobutylene, polyethylene, or polyester. The synthetic rubber may be made of isoprene, butadiene, chloroprene, isobutylene-isoprene, a nitrile, styrene-butadiene, ethylene-propylene, or ethylene-propylene-diene.

The through hole 4 has dimensions to engage with a lock projection 5B formed in a wiring substrate 1B. The through hole 4 is formed in the insulator layer 3 not to interfere with the conductors 2. The lock projection 5B has the same dimensions as a lock projection 5A of a wiring substrate 5A.

Figure 2:
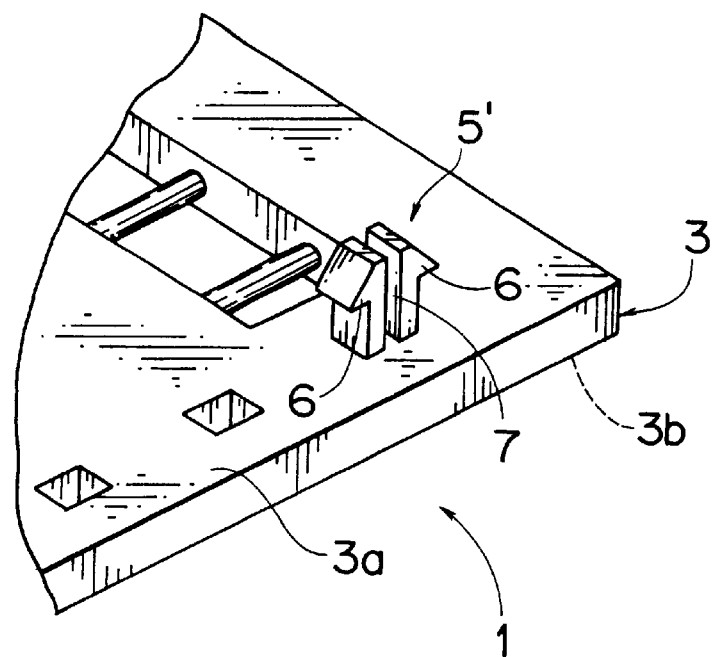
FIG. 2 is a perspective view showing a modified example of locking projections shown in FIG. 1.

The lock projection 5 has a hook-shaped latch portion 6 formed integrally therewith at a fore end thereof. As shown in FIG. 2, the lock projection 5' may have a slit 7 oriented in the extending direction of the lock projection 5'. This increases the lock projection 5' in flexibility in the lateral direction thereof, enabling an easy engagement of the lock projection 5' with an through hole 4B (see FIG. 1). The lock projections 5 or 5' shown in FIGS. 1, 2 may be provided on a top or bottom face 3a, 3b of the coating insulator layer 3. The latch portion 6 may be conical.

As shown in FIG. 1, there are provided a plurality of the through holes 4 and the lock projections 5 which align with one another on a straight line at each side portion of the coating insulator layer 3. The rows of the through holes 4 and the lock projections 5 are in parallel with the longitudinal direction of the electrical wire 2. Each row of the through holes 4 and the lock projections is symmetrical with one another to the longitudinal center line of the wiring substrate 1.

The lock projections 5 are spaced from one another with a given distance D. Between adjacent two of the lock projections 5, that is, within the distance D, there are arranged two through holes 4A, 4A' spaced from one another with a given distance d. The distance d is equal to the distance p between the lock projection 5 and the adjacent through hole 4. In this embodiment, the distance D is three times larger than the distance p.

Figure 3:
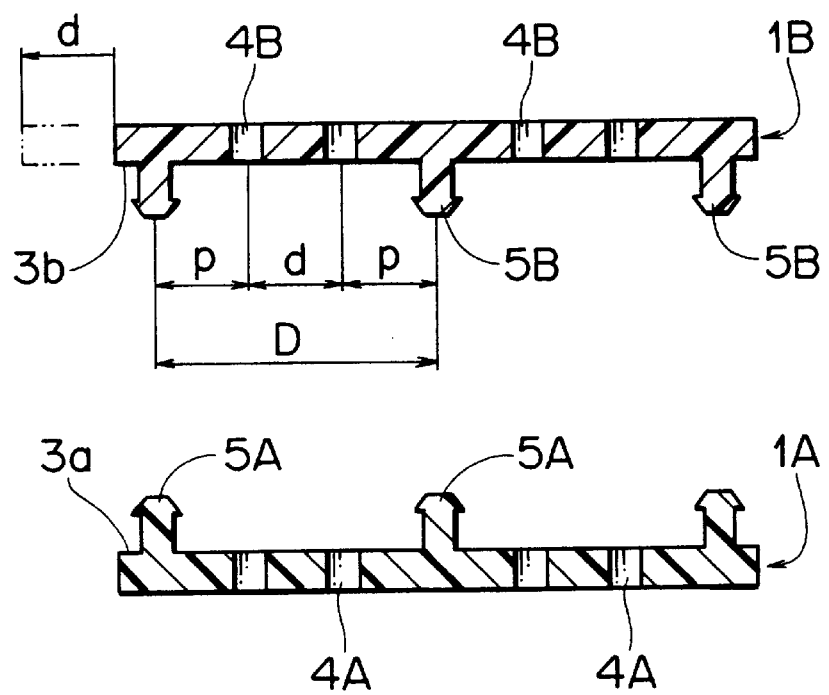
FIG. 3 is a view showing first and second wiring substrates which are disposed to oppose to one another with locking projections of the first wiring substrate being aligned with those of the second wiring substrate.
Figure 5:
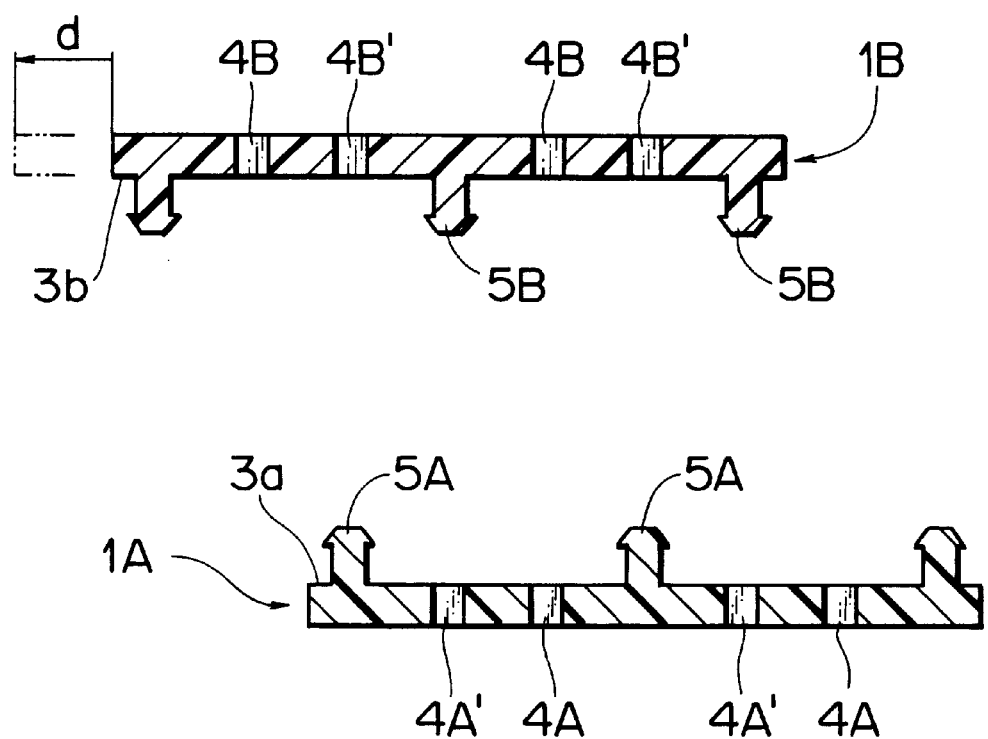
FIG. 5 is a view in which the second wiring substrate is horizontally shifted in the left by a distance d from the state shown in FIG. 4A.

At first, as shown in FIG. 3, first and second wiring substrates 1A, 1B are preliminarily disposed in parallel with one another such that the lock projections 6A of the first wiring substrate 1A oppose to the lock projections 5B of the second wiring substrate 1B. Next, as shown in FIG. 4A, the second wiring substrate 1B is moved to the left by the distance d in parallel with the first wiring substrate 1A, so that the lock projections 5A of the first wiring substrate 1A aligns with the through hole 4B of the second wiring substrate 1B. Furthermore, as shown in FIG. 5, the second wiring substrate 1B is moved to the left side by the distance d, so that the lock projection 5A of the first wiring substrate 1A aligns with the through hole 4B' adjacent to the through hole 4B of the second wiring substrate 1B.

Figure 6:
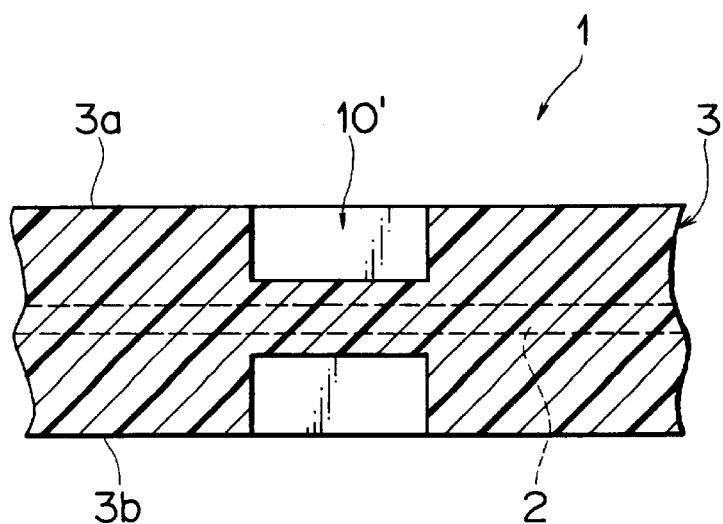
FIG. 6 is a sectional view showing connection portions modified from those shown in FIG. 1.

As shown in FIG. 1, in the top and bottom faces 3a, 3b of the coating insulator layer 3, there are formed a plurality of connection recesses 10 disposed in a direction intersecting with the longitudinal direction of the conductors 2. In the connection recesses 10, the conductors are exposed from the insulator layer 3. In this embodiment, the connection recesses 10 are positioned to align with the opposing lock projections 5, 5 in consideration of an adequate stress distribution of the first and second wiring substrates 1A, 1B after the final combination thereof. However, the connection recesses 10 may be positioned to align with the opposing through holes 4, 4 or may be otherwise arranged if desired. As another example of the connection recess 10, connection recesses 10' are provided in the top and bottom faces 3a, 3b of the coating insulator layer 3 by forming a thinner portion of the coating insulator layer 3 corresponding to each electrical wire as shown in FIG. 6.

Next, a process for manufacturing a wiring substrate 1 will be discussed.

Figure 7:
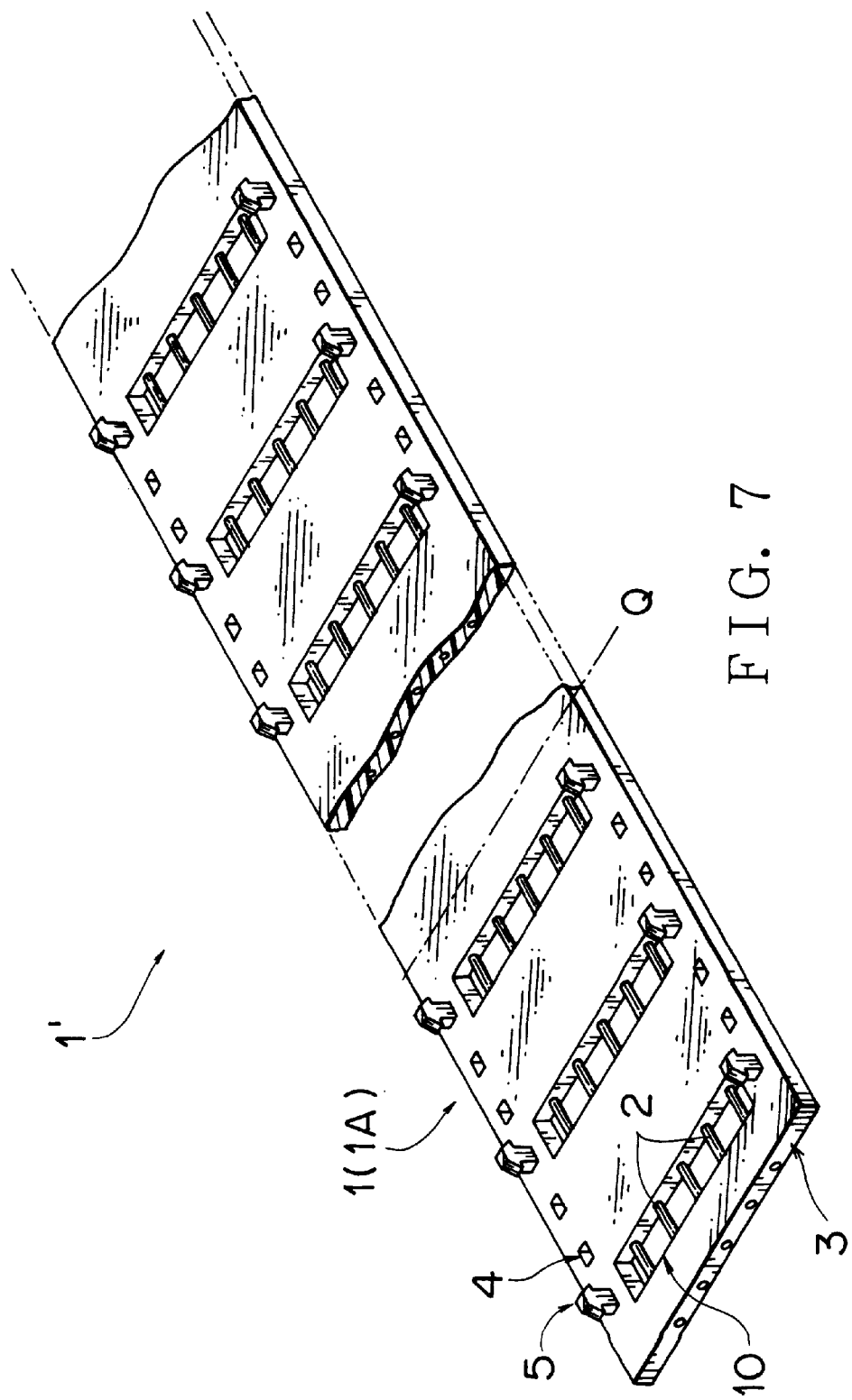
FIG. 7 is a perspective view showing a long wiring substrate.
Figure 8:
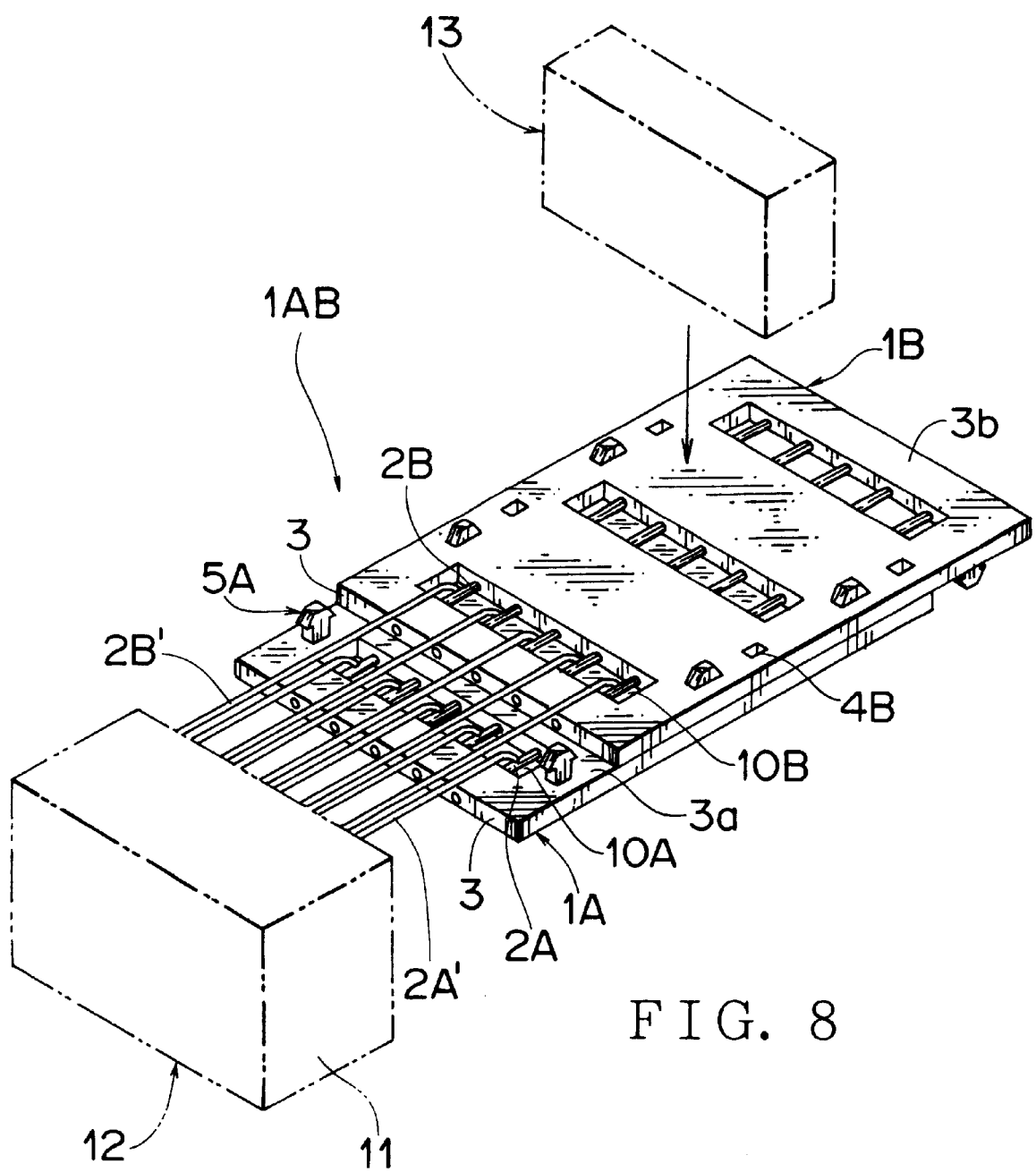
FIG. 8 is a perspective view of the wiring substrates, of which electrical wires in the connection portions of FIG. 1 have been connected to an external circuit.

As shown in FIG. 7, there are disposed a plurality of electrical wires 2 in parallel with one another on a lower forming mold (not shown). Then, an upper forming mold (also not shown) is mounted on the lower forming mold to be clamped together. In the clamped forming molds, a resin material is injected from an inlet of the forming molds. After cooled, the clamped upper and lower forming molds are parted from one another. The formed resin product undergoes press-cutting works to become a long wiring substrate 1' having through holes 4, lock projections 5, and connection recesses 10. The long wiring substrate 1' is cut into a plurality of short wiring substrates 1 having a desired length (for example, cut along a line Q). However, the upper and lower forming molds may have a dimension to directly produce a wiring substrate 1 having a desired short length Thus, the wiring substrates 1 can be continuously produced by the above-mentioned steps with an improved workability.

Furthermore, the long wiring substrate 1' may be cut into a plurality of wiring substrates 1 having any given length. Accordingly, one set of the upper and lower forming molds can provide wiring substrates 1 having any length, which allows the wiring substrates to be used in more kinds of wiring patterns than the conventional wiring substrate described in the prior art.

Moreover, the long wiring substrate 1' may have a larger width to provide a wide wiring substrate which will be folded back into two layers to form a two-layered wiring substrate assembly (not shown).

Next, referring to FIGS. 3 to 5, steps for layering the first and second wiring substrates 1A, 1B to form a two-layered wiring substrate assembly 1AB will be discussed.

As shown in FIG. 3, the first and second wiring substrates 1A, 1B are disposed in parallel with one another such that the lock projections 5A, 5B S oppose to each other. Then, as shown in FIG. 4A, the second wiring substrate 1B is moved to the left by the distance d, so that a lock projection 5A of the first wiring substrate 1A aligns with a through hole 4B of the second wiring substrate 1B, and a lock projection 5B of the second wiring substrate 1B aligns with a through hole 4A of the first wiring substrate 1A.

Thereafter, as shown in FIG. 4B, the first and second wiring substrates 1A, 1B are joined to one another, so that the lock projections 5A, 5B each advance into one of the through holes 4B, 4A. Then, fore end portions of the lock projections 5A, 5B each protrude through one of the through holes 4B, 4A, so that latch portions 6A, 6B each engage with a periphery of one of the through holes 4B, 4A. Thus, the first and second wiring substrates 1A, 1B are secured to one another at each side portion thereof to provide a two-layered wiring substrate assembly 1AB such that the second wiring substrate 1B is shifted horizontally from the first wiring substrates 1A by one pitch of the through holes.

Accordingly, the engagement of the lock projections 5A, 5B with the through holes 4B, 4A enables easy alignment and simple lamination of the first and second wiring substrates 1A, 1B, providing the two-layered wiring substrate assembly 1AB with an improved productivity.

The two-layered wiring substrate assembly 1AB decreases in manufacturing cost as compared with the conventional one described in the prior art which requires a fixing member or an adhesive for laminating a plurality of wiring substrates.

Figure 9:
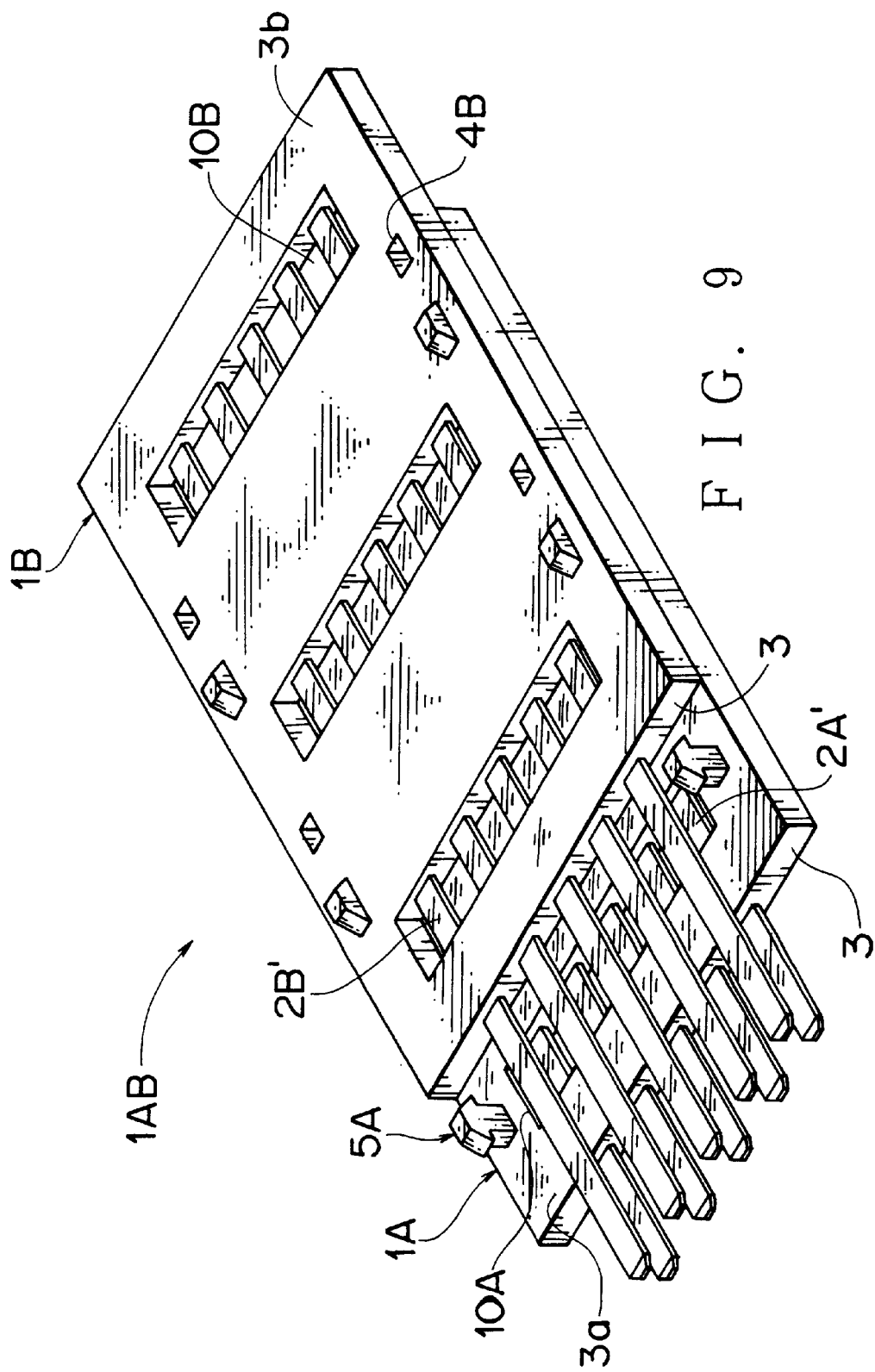
FIG. 9 is a perspective view of wiring substrates having busbars in place of the electrical wires of FIG. 1, and the busbars are extending from the wiring substrates to form connection terminals.

Moreover, as shown in FIG. 9, the two-layered wiring substrate assembly 1AB can be layered to have a step so that connection recesses 10A, 10B of the first and second wiring substrates 1A, 1B can be exposed together with the related electrical wires 2A, 2B. Thereby, the exposed electrical wires 2A, 2B can be directly connected to the associated electrical wires 2A', 2B' led from an external circuit (not shown). The electrical wires 2A', 2B' each may be provided with a terminal (not shown) crimping the other end of each wire. The terminals may be received in a housing to compose a connector 12.

In addition, the exposed electrical wire 2B in the connection recess 10B may be directly connected to an external instrument 13 which is an external circuit.

Referring again to FIG. 7, the connection recess 10' with a thin insulator layer can receive a press-crimping terminal (not shown) which will press into the thinner part of the insulator layer 3 to make press-contact with an electrical wire 2.

Meanwhile, as shown in FIG. 9, the conductors consisting of busbars 2A', 2B' may be extended from the wiring substrates 1A, 1B. The extended strips of the busbars 2A', 2B' can be utilized as connection terminals.

FIGS. 10 to 15 show a second embodiment of a wiring substrate according to the present invention.

Figure 10:
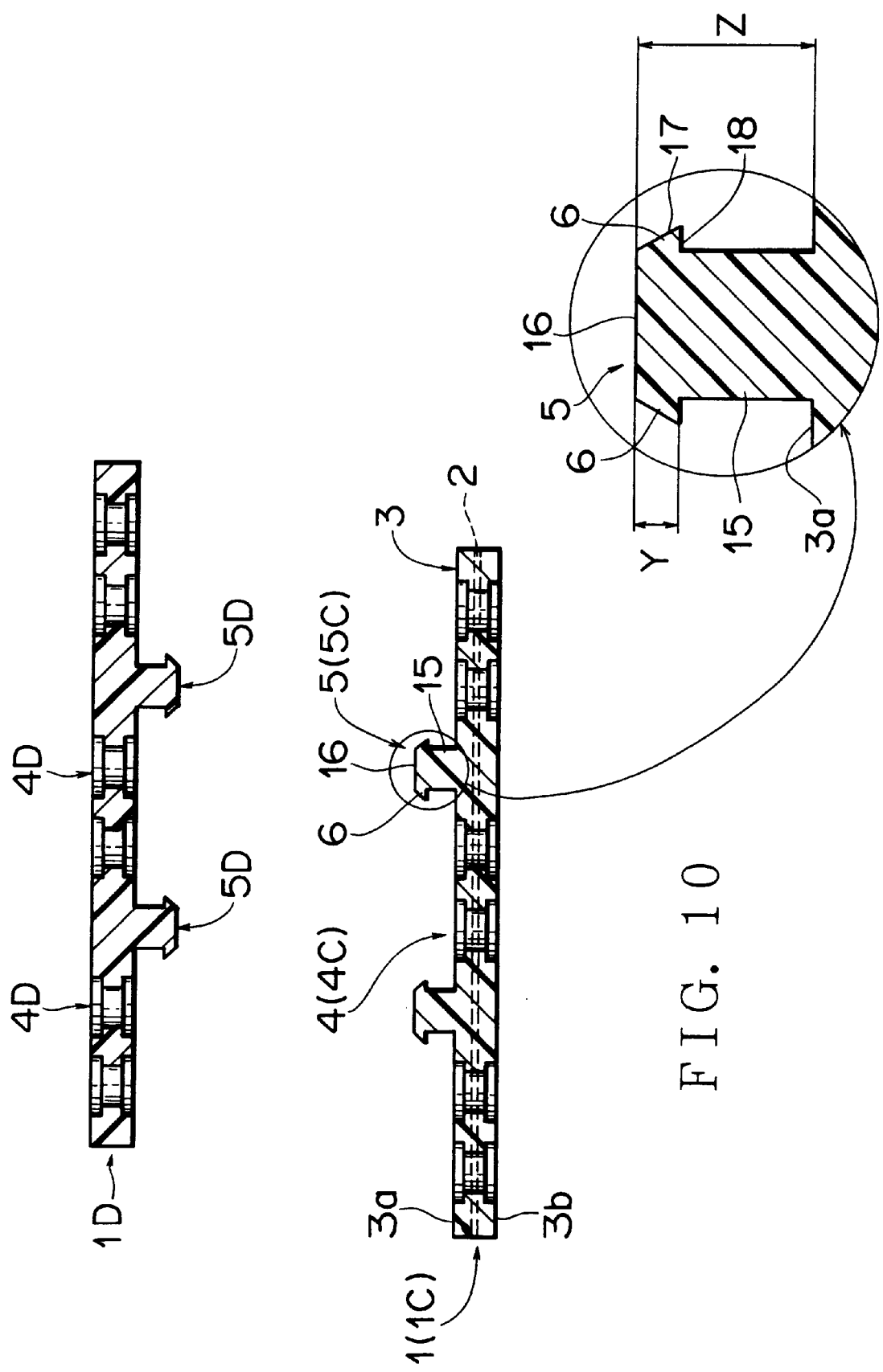
FIG. 10 is a sectional view showing wiring substrates of a second embodiment according to the present invention.

As illustrated in FIG. 10, a wiring substrate 1 has a plurality of electrical wires 2, an coating insulator layer 3 for covering the wires, a plurality through holes 4 formed in the insulator layer 3, and a plurality of locking projections 5 formed on an upper face 3a of the insulator layer 3.

In each side portion of the wiring substrate 1, there are provided two locking projections 5 and six through holes 4 which are spaced from each other with desired distances. Between the two locking projections 5, there are arranged two through holes 4. In an outside portion of each locking projection 5, there are also arranged two through holes 4. The other construction of the wiring substrate 1 which is almost the same as the first embodiment will not be discussed.

The locking projection 5 consists of a main body 15 extending from the upper face 3a of the insulator layer 3 and a hook portion 6 which is formed integrally with the main body 15 at a fore end portion of the main body 15. The main body 15 has a flat foremost surface 16. The hook portion 6 has a tapered surface 17 and a stopper face 18. The tapered surface 17 allows an easy insertion of a locking projection 5C into an through hole 4D. The stopper face 18 is flat and parallel with the flat foremost surface 16. The hook portion 6 may be formed in a conical shape.

Figure 11A:
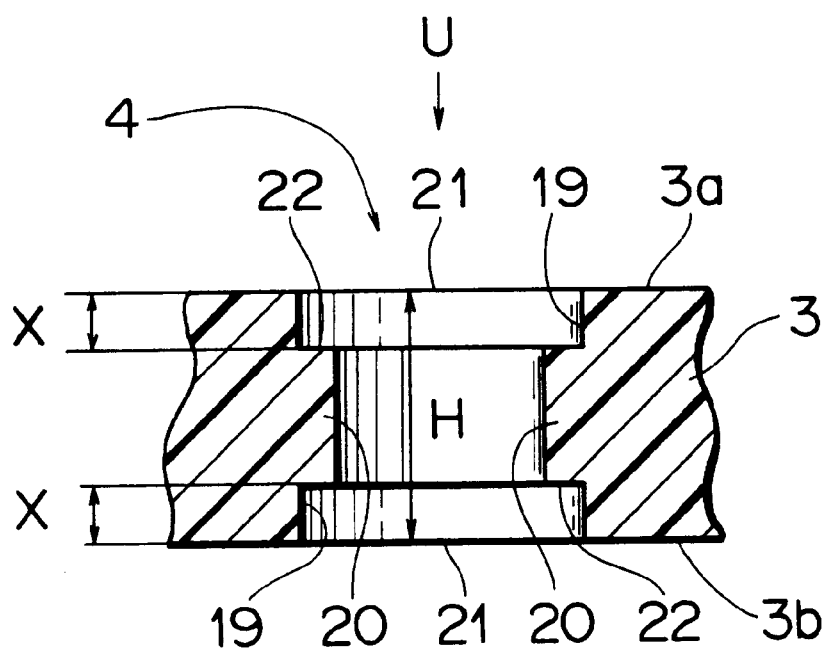
FIG. 11A is an enlarged sectional view showing a through hole of FIG. 10.
Figure 11B:
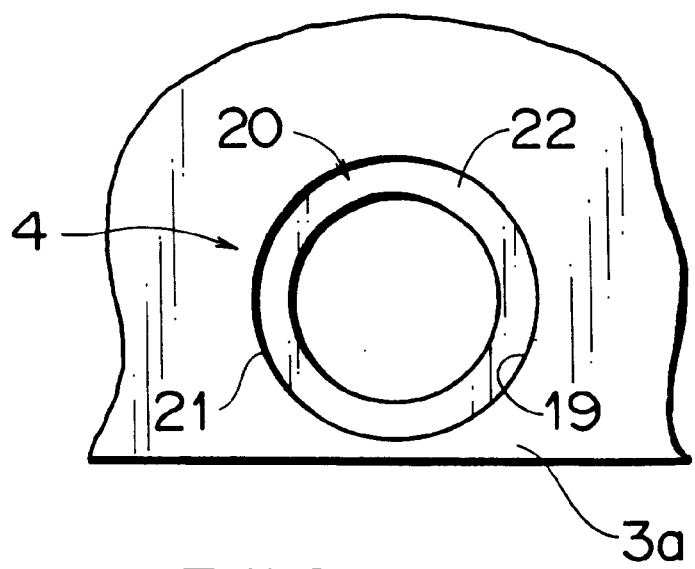
FIG. 11B is a view showing the through hole of FIG. 11A taken in the direction of an arrow U.

As shown in FIGS. 11A, 11B, in an inner surface 19 of the through hole 4, there is formed a locking stepped portion 20 at a middle thereof Thereby, the through hole 4 has a smaller sectional dimension at the middle than at each opened end 21 thereof The distance X from a stepped face 22 of the locking stepped portion 20 to the adjacent opened end 21 is equal to the distance Y (see FIG. 10) from the flat foremost surface 16 of the locking projection 5 to the stopper face 18 of the hook portion 6 (that is, X=Y). The depth H of the through hole 4 is equal to the distance Z (see FIG. 10) from the upper face 3a of the insulator layer 3 to the flat foremost surface 16 of the locking projection 5 (that is, H=Z). In addition, the wiring substrate 1 has flat top and bottom faces so that the depth H is equal to the thickness of the insulator layer 3.

Next, referring to FIG. 10, a process (steps) for laminating the first wiring substrate 1C and the second wiring substrate 1D will be discussed. Since the engagement step of the locking projections 5C of the first wiring substrate 1C with the through holes 4D is the same as that of the locking projections 5D of the second wiring substrate 1D with the through holes 4C, one of the engagement step will be discussed.

The first and second wiring substrates 1C, 1D each have the through holes 4C or 4D and the locking projections 5C or 5D which are equally spaced from one another. When the first and second wiring substrates 1C, 1D are disposed to oppose to one another such that the locking projections 5C align with the through holes 4D, the locking projections 5D align with the through holes 4C. Then, the second wiring substrate 1D is engaged with the first wiring substrate 1C so that the hook portion 6 of the locking projection 5C enters into the opened surface 21 of the through hole 4 as shown FIG. 11. Thereafter, the stopper face 18 of the hook portion 6 abuts against the stepped face 22 of the locking stepped portion 20 so that the locking projection 5C is locked in the through holes 4D.

In this locked condition, the locking projection 5C is completely received in the through holes 4D with no extension from the through holes 4D. Since the locking projection 5C has the flat foremost surface 16, the bottom face 3b of the second wiring substrate 1D is kept flat. Similarly, the locking projection 5D of the second wiring substrate 1D does not extend from the through hole 4C of the first wiring substrate 1C so that the bottom face 3b of the first wiring substrate 1C is kept flat. This provides a two-layered wiring substrate assembly 1CD consisting of the first and second wiring substrates 1C, 1D.

As described above, the locking projections 5C, 5D of the first and second wiring substrates 1C, 1D each engage with one of the through holes 4D or 4C. Thus, the first and second wiring substrates 1C, 1D are aligned with and combined to one another to be layered with a more simplified step than the prior art. This provides a manufacturing step improved in productivity of the two-layered wiring substrate assembly 1CD.

Moreover, the completed two-layered wiring substrate assembly 1CD has flat outermost surfaces 25C, 25D. Thus, the two-layered wiring substrate assembly 1CD can be arranged in a vehicle body with little interference with electrical instruments (not shown) mounted in the vehicle body. This provides a mounting step improved in productivity of the two-layered wiring substrate assembly 1CD in assembling within the vehicle body.

Next, a process (steps) for manufacturing a five-layered wiring substrate assembly 1CG by laminating five wiring substrates 1 will be discussed.

Figure 12:
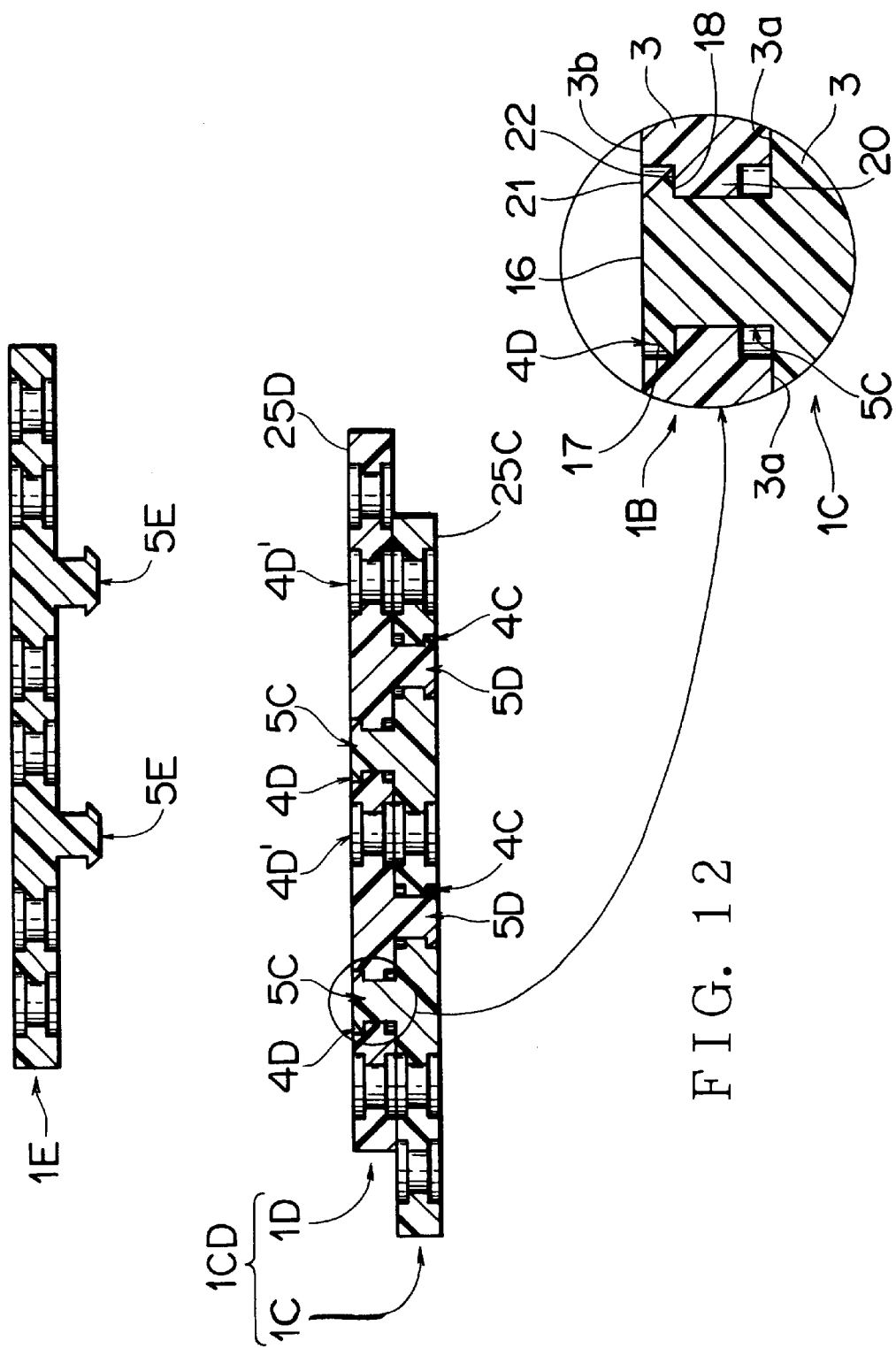
FIG. 12 is a sectional view showing a two-layered wiring substrate assembly consisting of first and second wiring substrates and for showing a third wiring substrate.

As shown in FIGS. 10, 12, a two-layered wiring substrate assembly 1CD is assembled by laminating first and second wiring substrates 1C, 1D. This step that has been already described will not be discussed again.

Figure 13:
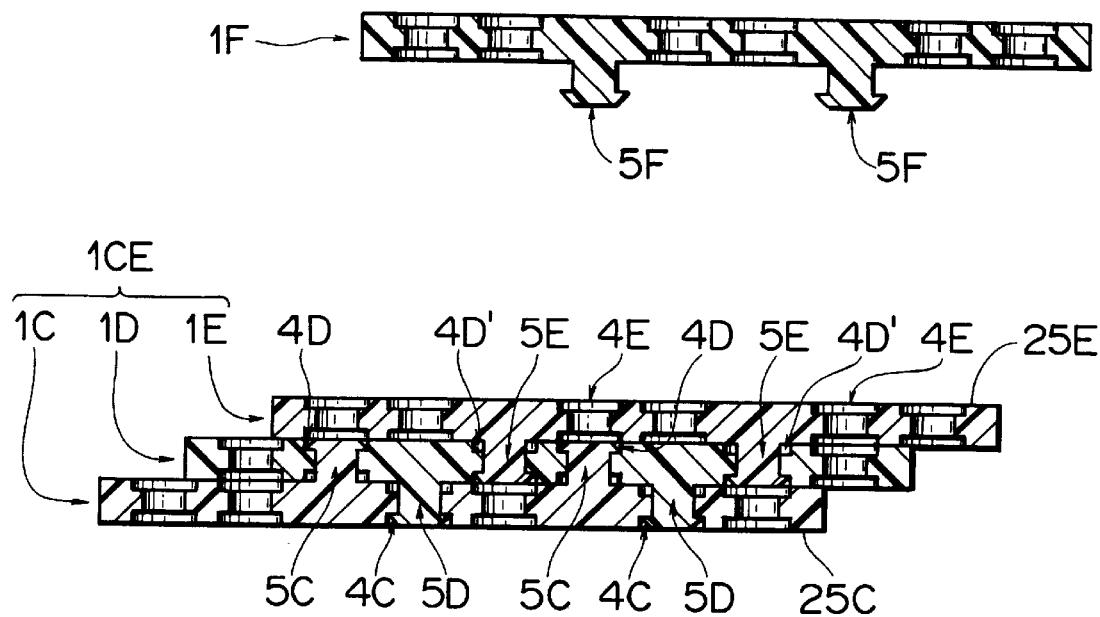
FIG. 13 is a sectional view showing a three-layered wiring substrate assembly consisting of the two-layered wiring substrate assembly of FIG. 12 and a fourth wiring substrate.

Referring to FIGS. 12, 13, a step for completing a three-layered wiring substrate assembly 1CE by laminating a third wiring substrate 1E on the two-layered wiring substrate assembly 1CD will be discussed.

The third wiring substrate 1E is disposed such that the locking projections 5E of the third wiring substrate 1E opposes to the through hole 4D' of the second wiring substrate 1D. Then, the third wiring substrate 1E is pushed toward the second wiring substrates 1D of the two-layered wiring substrate assembly 1CD. Thereby, the locking projections 5E of the third wiring substrate 1E engage with the through holes 4D' of the second wiring substrate 1D to form a three-layered wiring substrate assembly ICE. The assembly 1CE has flat outermost surfaces 25C, 25E.

Figure 14:
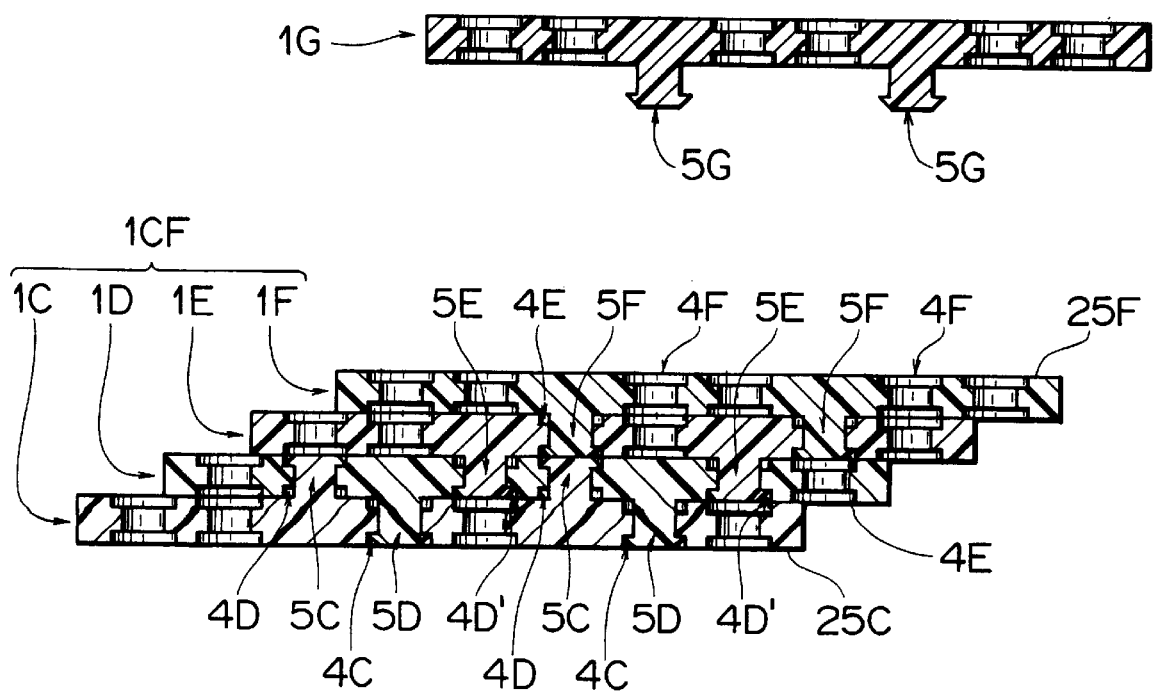
FIG. 14 is a sectional view showing a four-layered wiring substrate assembly and for showing a fifth wiring substrate.

Referring to FIGS. 13, 14, a step for assembling a four-layered wiring substrate assembly 1CF by laminating a fourth wiring substrate 1F on the three-layered wiring substrate assembly 1CE will be discussed.

The fourth wiring substrate 1F is disposed such that the locking projections 5F of the fourth wiring substrate 1F oppose to the through holes 4E of the third wiring substrate 1E. Then, the fourth wiring substrate 1F is pushed toward the third wiring substrates 1E of the three-layered wiring substrate assembly 1CE. Thereby, the locking projections 5F of the fourth wiring substrate 1F engage with the through holes 4E of the third wiring substrate 1E to form the four-layered wiring substrate assembly 1CF which. The assembly 1CF has flat outermost surfaces 25C, 25F.

Referring to FIG. 14, 15, a step for assembling a five-layered wiring substrate assembly 1CG by laminating a fifth wiring substrate 1G on the four-layered wiring substrate assembly 1CF will be discussed.

The fifth wiring substrate 1G is disposed such that the locking projections 5G of the fifth wiring substrate 1G oppose to the through holes 4F of the fourth wiring substrate 1F. Then, the fifth wiring substrate 1G is pushed toward the fourth wiring substrate 1F of the four-layered wiring substrate assembly 1CF. Thereby, the locking projections 5G of the fourth wiring substrate 1F engage with the through holes 4F of the fourth wiring substrate 1F to form the five-layered wiring substrate assembly 1CG shown in FIG. 15. The assembly 1CG has flat outermost surfaces 25C, 25G.

Figure 15:
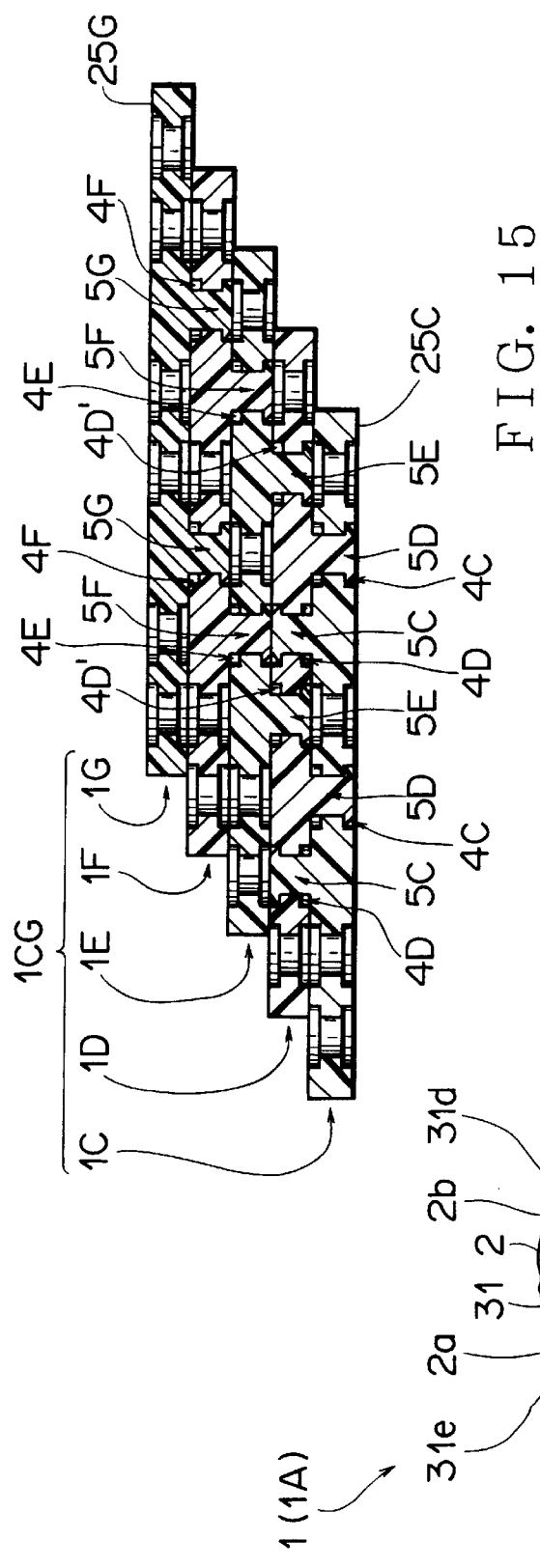
FIG. 15 is a sectional view showing a five-layered wiring substrate assembly.

In the assembling steps shown in FIG. 13 to 15, on the outermost surface 25D of the two-layered wiring substrate assembly 1CD there are sequentially laminated the third wiring substrate 1E, the fourth wiring substrate iF, and the fifth wiring substrate 1G. Alternatively, on the other outermost surface 25C of the two-layered wiring substrate assembly 1CD, there may be sequentially stacked the third wiring substrate 1E, the fourth wiring substrate 1F, and the fifth wiring substrate 1G, because each outer surfaces 25C, 25D, 25E, and 25F of the two-layered wiring substrate assembly 1CD, the three-layered wiring substrate assembly 1CE, and the four-layered wiring substrate assembly 1CF are formed to be flat.

FIGS. 16 to 20 show a third embodiment of a wiring substrate according to the present invention.

Figure 16:
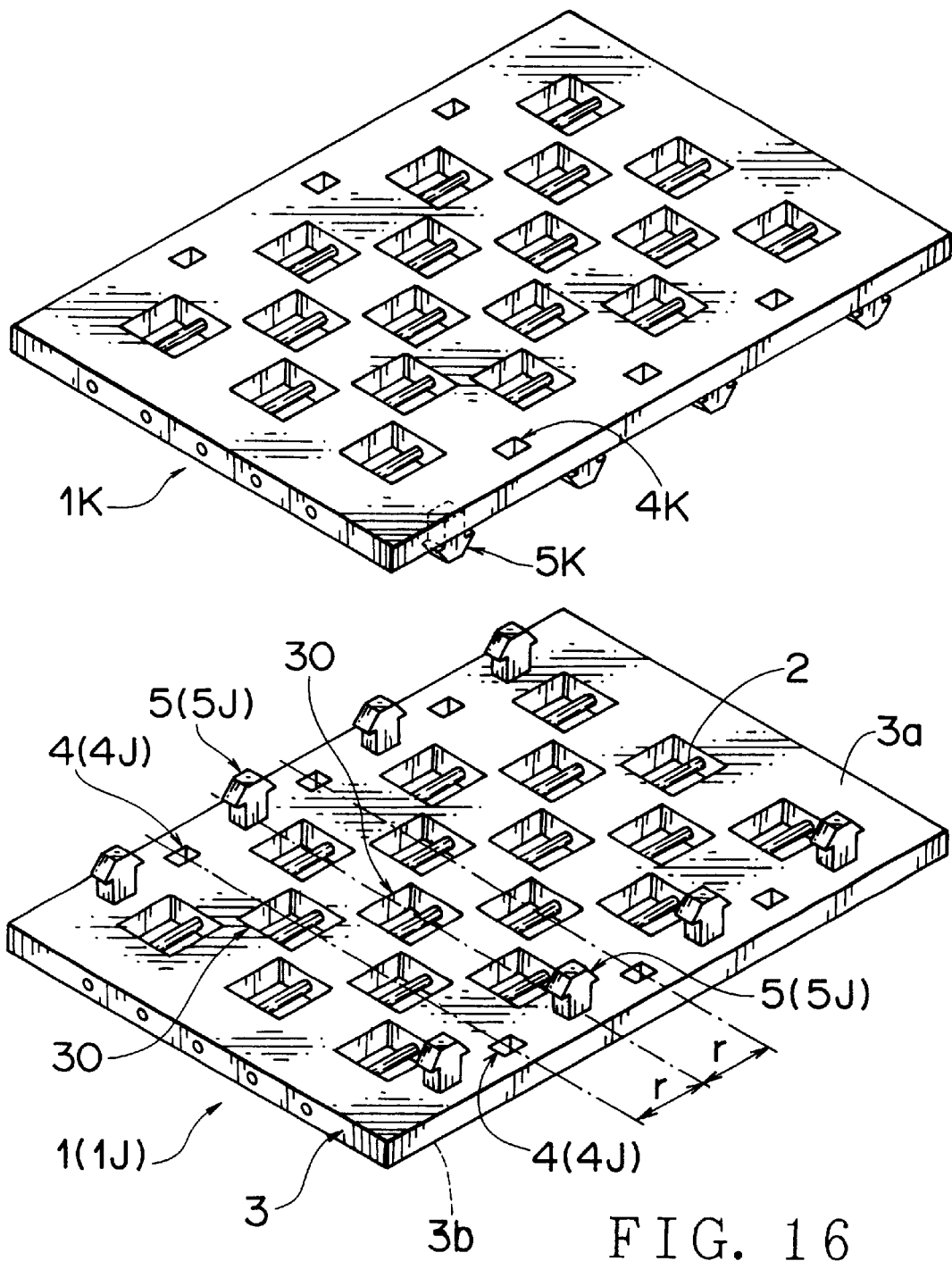
FIG. 16 is a perspective view showing first and second wiring substrates of a third embodiment according to the present invention.

As illustrated in FIG. 16, a wiring substrate 1 has a plurality of electrical wires 2, a coating insulator layer 3 for covering the wires, a plurality through holes 4 formed in the insulator layer 3, and a plurality of locking projections 5 formed on an upper face 3a of the insulator layer 3. The other construction of the wiring substrate 1 which is almost the same as the first embodiment will not be discussed.

The through holes 4 and the locking projections 5 are alternately positioned with regular intervals. That is, the locking projections 5 are positioned with the interval 2r and one of through holes 4 is positioned at the middle of adjacent two of locking projections 5.

In top and bottom surfaces 3a, 3b of the insulator layer 3 there are formed a plurality of connection recesses 30 which are disposed to compose, for example, a checkered grid pattern. In each connection recess 30, one of the electrical wires 2 is exposed.

Figure 17:
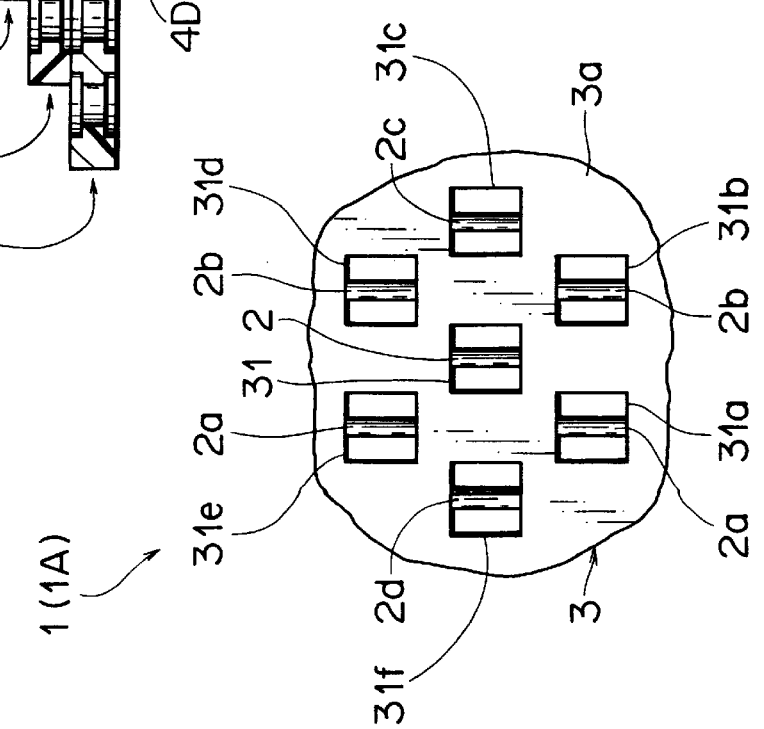
FIG. 17 is a plan view showing an arrangement of connection portions of FIG. 16 for illustrating one connection portion surrounded by other connection portions.

In this embodiment, as shown in FIG. 17, one connection recess 31 is isolated from adjacent connection recesses 31a to 31f by the insulator layer 3. Thus, an exposed electrical wire 2 within the connection recess 30 is isolated from electrical wires 2a to 2d exposed in the adjacent connection recesses 31a to 31f, which is different from the connection recess 10 of the first embodiment shown in FIG. 1.

In this embodiment, as shown in FIG. 16, the connection recesses 30 align in line with the locking projections 5 or the through holes 4 in a lateral direction of the conductors 2. Each lateral row of them is spaced from one another with a distance r. Between two laterally opposing projections 5 there are provided three connection recesses 30, while between two opposing through holes 4 there are provided two connection recesses 30.

Next, a process (steps) for assembling a two-layered wiring substrate assembly 1JK by laminating a first wiring substrate 1J and a second wiring substrate 1K will be discussed.

Similarly to the first and second embodiments, as shown in FIG. 16, some locking projections 5J of the first wiring substrate 1J are aligned to oppose to some through holes 4K of the second wiring substrate 1K. Furthermore, some locking projections 5K of the second wiring substrate 1K are aligned to oppose some through holes 4J of the first wiring substrate 1J. Then, the second wiring substrate 1K is pushed to engage with the first wiring substrate 1J so that locking projections 5J, 5K are received to be locked in the relative through holes 4K, 4J to complete the two-layered wiring substrate assembly 1JK as shown in FIGS. 18, 19.

Figure 18:
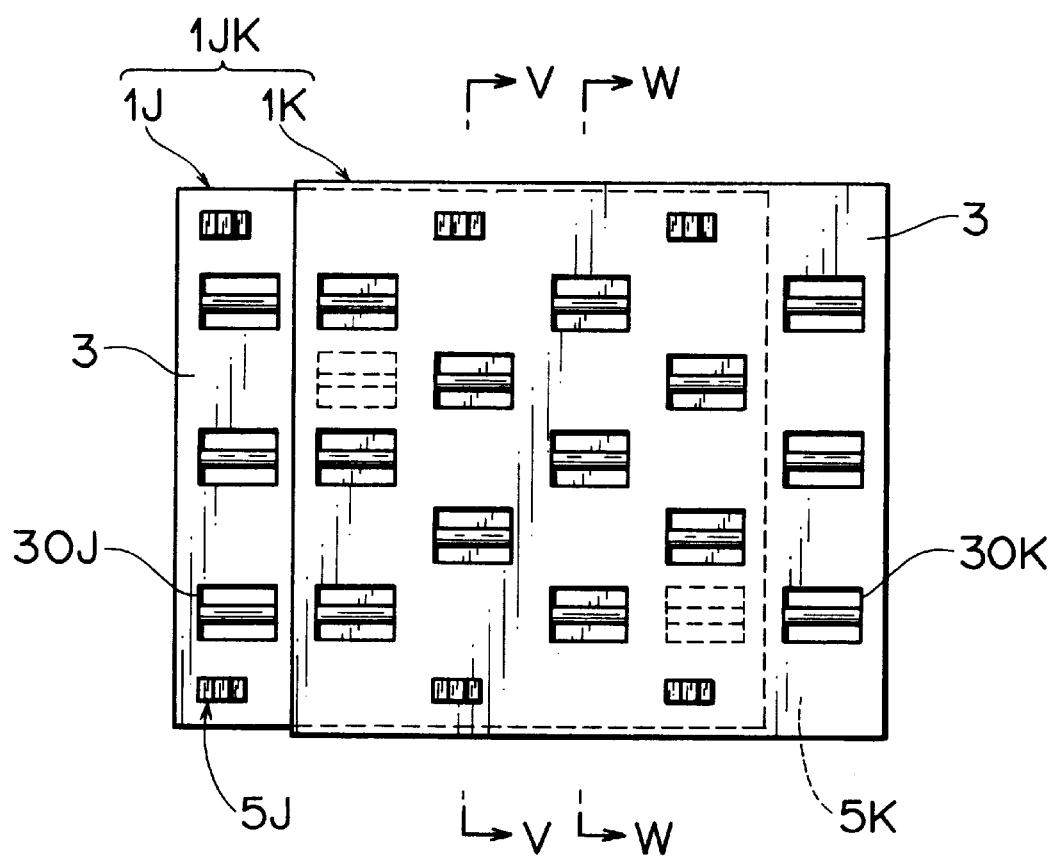
FIG. 18 is a plan view showing the first and second wiring substrates of FIG. 16 which are joined to one another.
Figure 19:
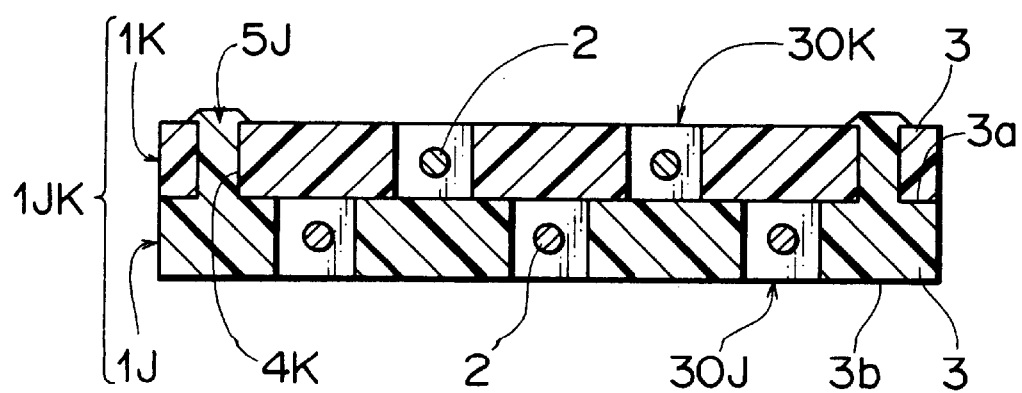
FIG. 19 is a sectional view taken along the line V—V of FIG. 17.
Figure 20:
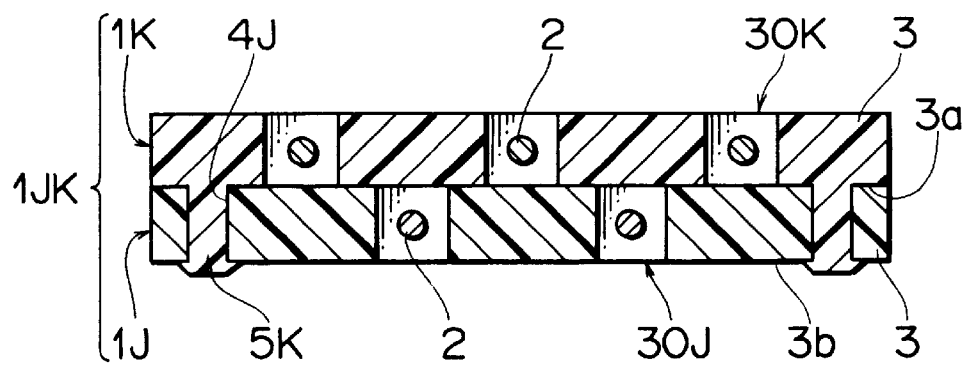
FIG. 20 is a sectional view taken along the line W—W of FIG. 17.

In the completed condition, as illustrated in FIGS. 18, 19, connection recesses 30J of the first wiring substrate 1J oppose to a surface of the insulator layer 3 of the second wiring substrate 1K, while connection recesses 30K of the second wiring substrate 1K oppose to a surface of the insulator layer 3 of the first wiring substrate 1J. That is, the connection recesses 30J, 30K of the two-layered wiring substrate assembly 1JK do not overlap one another and are isolated from each other by the insulator layer 3. Accordingly, even in applications where moisture may be encountered, there is little possibility of current leakage due to moisture condensation of the electrical wires 2 in the two-layered wiring substrate assembly 1JK. That is, the two-layered wiring substrate assembly 1JK provides a sufficient insulation between the wiring substrates 1J, 1K. The two-layered wiring substrate assembly 1JK is better than the first embodiment in insulation of connection recesses 30.

The first to third embodiments shown in FIGS. 1, 10, 16 each may be modified to provide a multi-layered wiring substrate assembly having more than two wiring substrates. Furthermore, an adequate combination in construction of the first to third embodiments may provide a modified wiring substrate 1 to assemble a compound wiring substrate (not shown) if desired.

Figure 21:
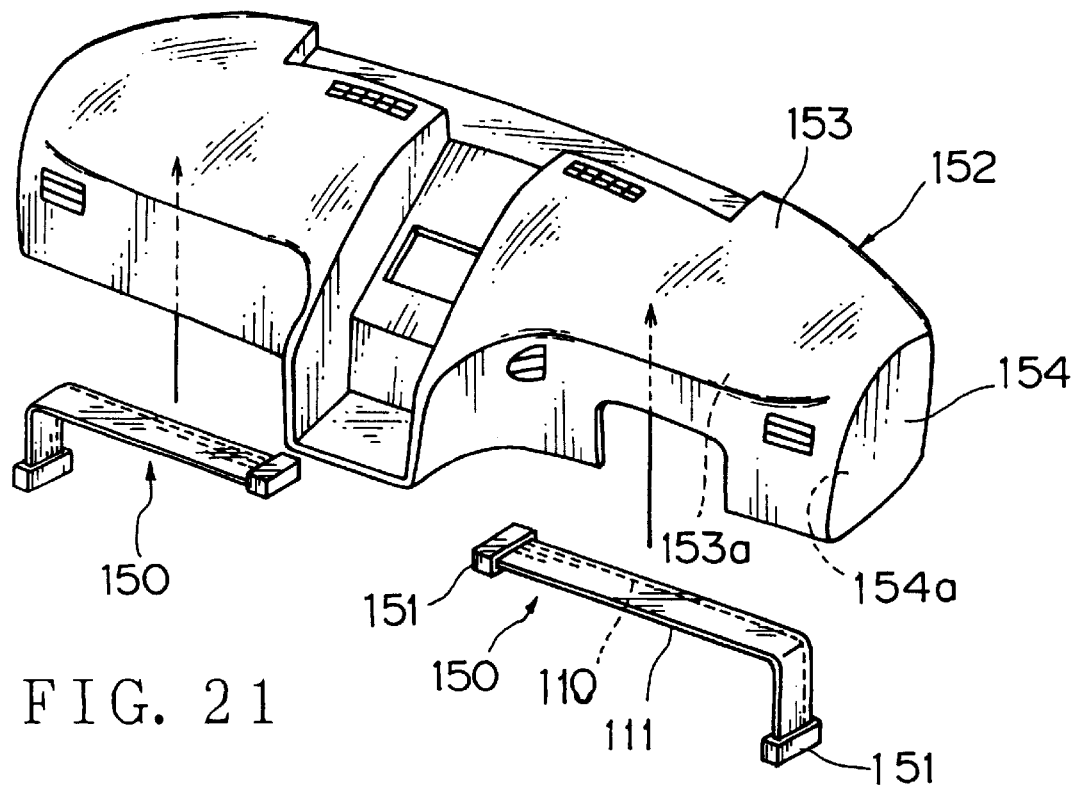
FIG. 21 is a perspective view showing a forth embodiment of a wiring substrate according to the present invention.

FIG. 21 is a fourth embodiment of a wiring substrate according to the present invention. A wiring substrate 150 has a plurality of electrical wires (conductors) 110 and an insulator layer 111 covering the electrical wires.

The electrical wires 110 are equally spaced in parallel with one another. The wiring substrate 150 shown in FIG. 21 is electrically connected to a connector 151 at each end thereof Other electric or electronic parts (not shown) may be connected in place of the connectors 151.

The insulator layer 111 which is made of a resin is flexible together with the electrical wires 110 after the molding thereof. The electrical wires 110 are inserted in the insulator layer 111 when molded therewith. Thus, the wiring substrate 150 can be easily modified in shape along different walls of an instrument panel 152 (corresponding to the structural wall described in the summary of the invention) of a vehicle body (not shown). The wiring substrate 150 may be applied in a door panel, a roof panel, or the like as well as in the instrument panel 152.

On disposing the wiring substrate 150 along inner surfaces 153a, 154a of top and side walls 153, 154 (corresponding to the structural wall described in the summary of the invention) of the instrument panel 152, the wiring substrate 150 is bent into an L-shape, because the side wall 154 is formed by bending the top wall 153. In this embodiment, only one bend is applied to the wiring substrate 150 to conform to the inner surfaces 153a, 154a of top and side walls 153, 154. Two or more bends may be applied to the wiring substrate 150.

Moreover, the flexible wiring substrate 150 eliminates the need for different types of forming molds (not shown) which would be otherwise necessary for insert-molding to conform to different wall shapes of the instrument panel 152. That is, the flexible wiring substrate minimizes the number of forming molds to form differently shaped wiring substrates.

The flexible wiring substrate 150 is bent by a means such as hand, a tool, or a press machine which is selected according to the material property of the insulator layer 111. The wiring substrate 150 is finally secured to the top and side walls 153, 154 of the instrument panel 152 by an adequate securing means such as a lock device.

Figure 22:
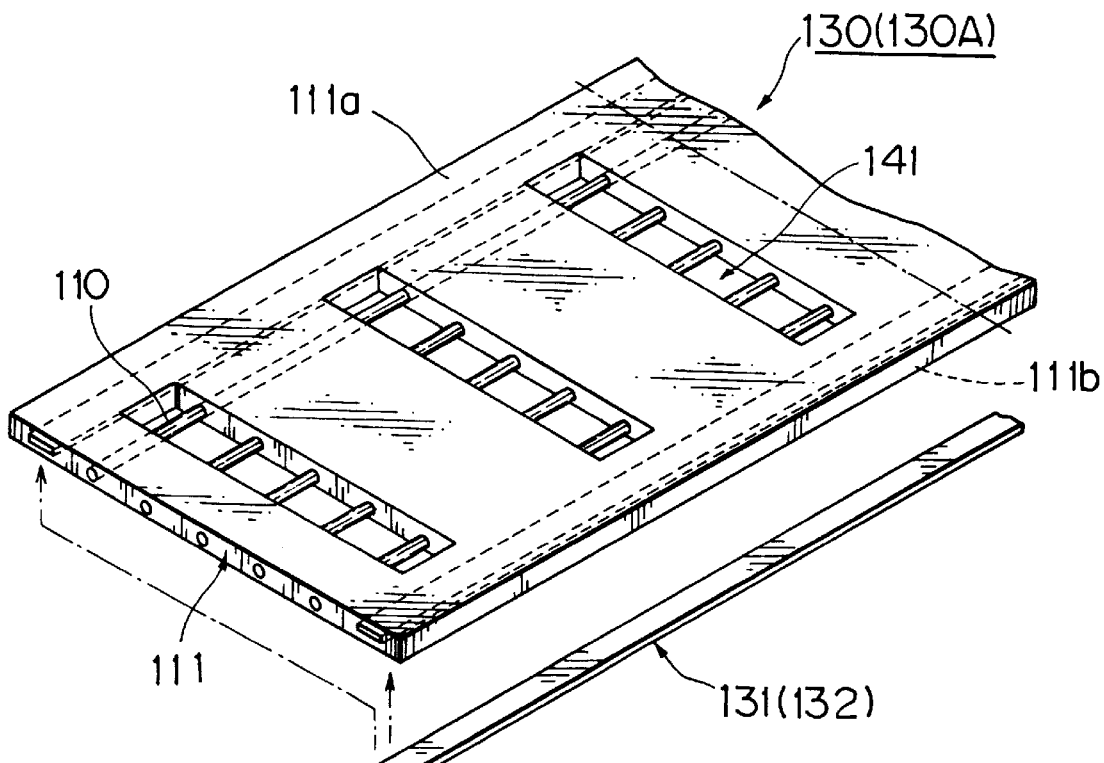
FIG. 22 is a perspective view showing a fifth embodiment of a wiring substrate according to the present invention.

FIGS. 22 to 27 show a fifth embodiment of a wiring substrate according to the present invention. As shown in FIG. 22, a wiring substrate 130 has a plurality of electrical wires (conductors) 110, an insulator layer 11 covering the electrical wires 110, and reinforcing means 131 disposed in the insulator layer 111.

The flexible conductor circuit 150 of the first embodiment (FIG. 21) may suffer a damage of the electrical wires 110 or the insulator layer 111 when provided with a repeating horizontal or lateral bending force. Therefore, as shown in FIG. 22, the second embodiment has the reinforcing means 131 disposed in the insulator layer 111 for protecting the electrical wires 110 and the insulator layer 111. The reinforcing means 131 is a reinforcing member 132 having a sectional shape of a rectangle or a circle, or may be a flat bar 132.

A couple of reinforcing members 132 are disposed longitudinally in parallel with the electrical wires 110 in each outside of the electrical wires 110. The reinforcing member 132 is made of a material like iron that has a larger strength (a larger bending strength) than the electrical wire 110. Preferably, the reinforcing member 132 may be made of an electrically non-conductive material. The reinforcing member 132 has the same length as the electrical wire 110. Thus, the provision of the reinforcing members 132 prevents the electrical wires 110 from damage due to a repeating bending force. The reinforcing members 132 may be disposed partially in the insulator layer 111.

A harder reinforced part of the insulator layer 111 provides a hard portion (not shown) of the wiring substrate 130 which serves to keep the wiring substrate 130 in a final shape. Meanwhile, the provision of a less reinforced part (not shown) is available to bend the wiring substrate 130. Numeral 141 shows a connection portion formed in the insulator layer 111. The connection portion 141 provides an exposed electrical wire 110 which will be connected directly to an external circuit (not shown). The connection portion 141 may be disposed in a desired position and/or may be formed in a desired shape. In this embodiment, top and bottom surfaces 111a, 111b of the insulator layer 111 are flat. The flat surfaces 111a, 111b may be formed by press-forming the molded wiring substrate 130.

Next, referring to FIGS. 25 to 27, a process for forming different types of wiring substrates 130B, 130C, 130D will be discussed. A plurality of electrical wires 110 are equally spaced in parallel with one another as shown in FIG. 23. A couple of reinforcing members 132 are arranged each outside of the electrical wires 110. Such arranged electrical wires 110 and reinforcing members 132 are combined with, for example, an elastomer by insert-molding to obtain a long wiring substrate 130'. A plurality of wiring substrates 130A having a desired length are provided by cutting the long wiring substrate 130' at the corresponding positions as shown in FIG. 28. However, a plurality of wiring substrates 130A having a final short length may be directly formed in an initial insert-molding.

Figure 25:
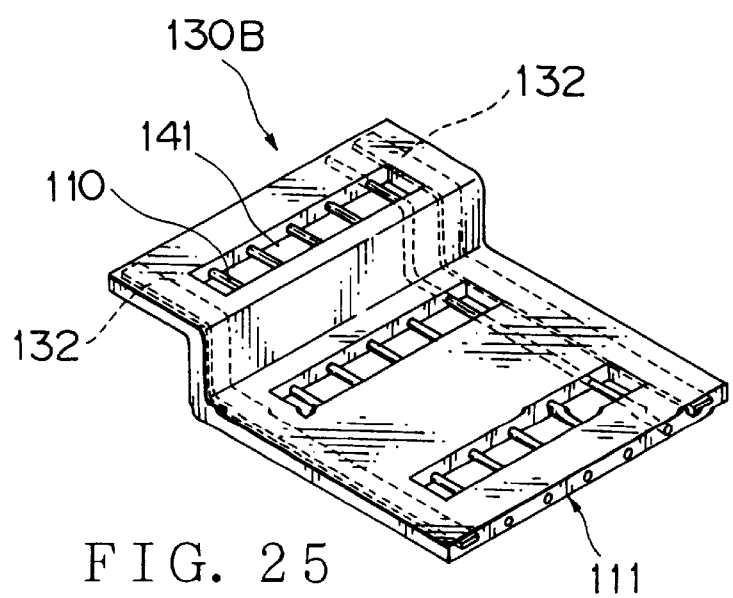
FIG. 25 is a perspective view showing a wiring substrate which has been formed by the press device of FIG. 24.
Figure 24:
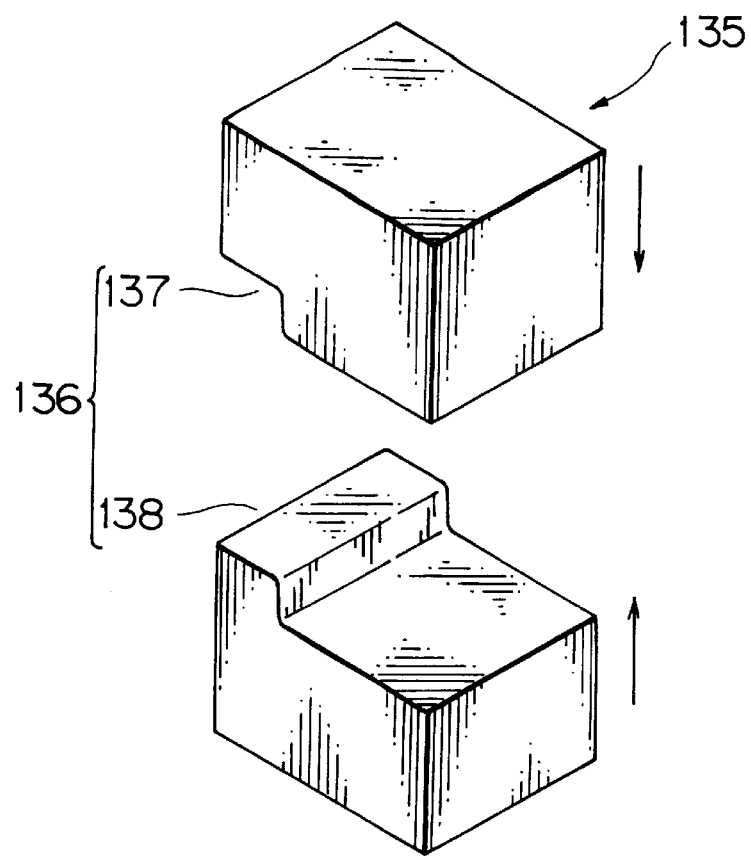
FIG. 24 is a perspective view of a press device for press-molding the wiring substrate of FIG. 22.
Figure 27:
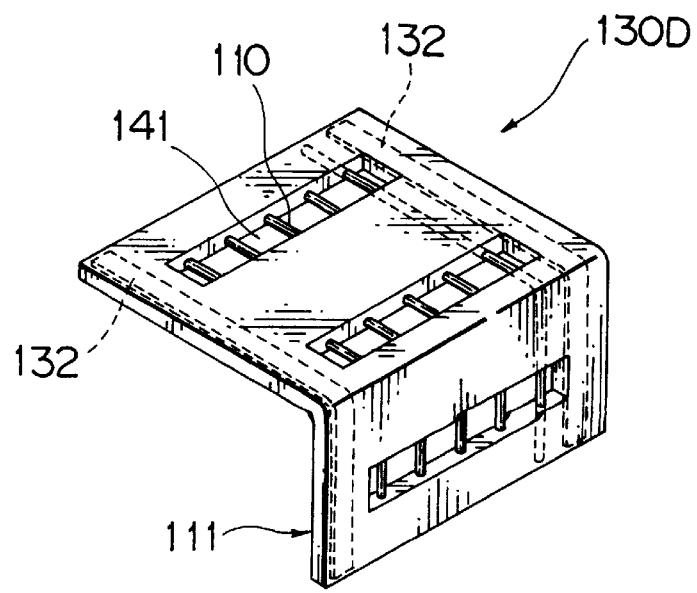
FIG. 27 is a perspective view showing further another wiring substrate which has been formed by the press device of FIG. 24.

Then, the differently shaped wiring substrates 130B, 130C, 130D shown in FIGS. 25 to 27 are completed by press-forming (bending) standard wiring substrates 130A to comply with desired wiring patterns. In the press-forming, as shown in FIG. 24, there is provided a press device 135 having a press forming mold 136 that consists of an upper mold 137 mounted on an end of a vertically reciprocating ram (not shown) and a lower mold 138 mounted on a bed (not shown) positioned below the ram. The combination of adequate types of upper and lower molds 137, 138 allows a surface 111a or 111b of the wiring substrate 130A shown in FIG. 22 to be formed into a desired shape, for example, shown in the wiring substrate 130B of FIG. 25.

As shown in FIG. 25, this forming step modifies the electrical wires 110, the insulator layer 111, and the reinforcing members 132 along the shape of the press-forming mold 136. The reinforcing members 132 having an adequate plasticity allows the final modification of the wiring substrate 130B including the electrical wires 110 and the insulator layer 111, though the electrical wires 110 and the insulator layer 111 do not serve to keep the final shape of the wiring substrate 130B. That is, after the press-forming, the wiring substrate 130B together with the electrical wires 110 can keep the modification. The modified wiring substrates 130C, 130D of FIGS. 26, 27 which have almost the same features as the wiring substrate 130B of FIG. 25 will not be discussed.

As mentioned above, the combination of some types of forming molds 136 can modify the standard wiring substrate 130A shown in FIG. 22 into the wiring substrates 130B to 130D (see FIGS. 25 to 27) each having a desired shape. Thus, the provision of a small number of different press-forming molds 136 (see FIG. 24) can easily produce a plurality of wiring substrates each having a configuration corresponding to a desired wiring pattern. This minimizes the number of different forming molds as compared with a conventional process for producing such wiring substrates.

The standard wiring substrate 130A shown in FIG. 22 can be formed so as to conform to a desired wiring pattern with an easier work than when a resin material is molded to cover the electrical wires 110 specifically for each desired wiring pattern.

In this embodiment, as shown in FIG. 22, the reinforcing members 131 are applied to keep the final shape of the wiring substrate 130 after the press-forming. However, the reinforcing members 131 may be replaced by another adequate reinforcing means.

FIGS. 28 to 33 show an example of a fitting structure for mounting a wiring substrate according to the present invention. As shown in FIG. 28, the fitting structure includes a plurality of through holes 102 formed in a wiring substrate 101 and the associated locking projections 105. The projections 105 are provided on a wall 104 of a panel 103 so as to be engageable with the through holes 102.

Figure 29:
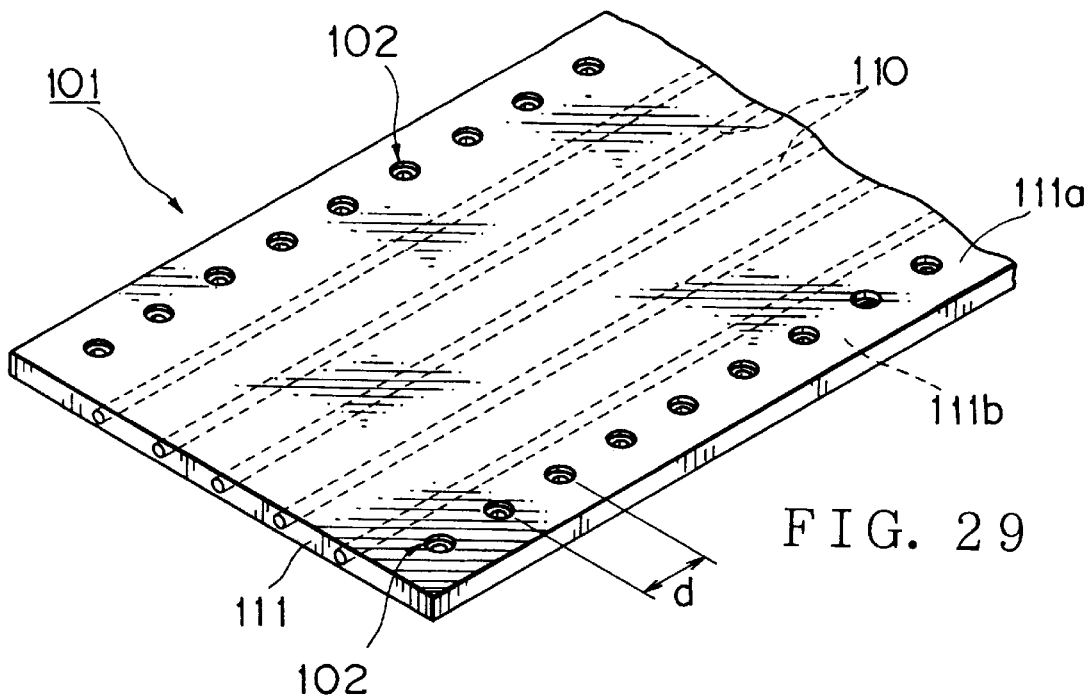
FIG. 29 is an enlarged perspective view showing the wiring substrate of FIG. 28.

As shown in FIG. 29, the wiring substrate 1 has a plurality of electrical wires (conductors) 110, a coating insulator layer 111 for covering the wires 110, a plurality through holes 102 formed in the insulator layer 111. The reinforcing members 132 (see FIG. 22) described in the aforementioned embodiment may be disposed in the insulator layer 111.

The conductor 110 and the insulator layer 111 have the same features in material and construction as those of the fourth and fifth embodiments, which will not be discussed again.

As shown in FIG. 30A, the plurality of through holes 102 are disposed not to interfere with the electrical wires 110 and to be opened in each surface 111a, 111b of the insulator layer 111. The through holes are arranged on a line longitudinally parallel to the conductors 110 and are spaced from one another with a distance d. The through hole 102 has a size to receive completely one of the locking projections 105. The through hole 102 has an inner surface 112 formed with a stepped portion 113 (corresponding to the lock portion described in the summary of the invention) inwardly extending in a middle portion thereof, so that the through hole 102 has the middle portion smaller than each end open portion 114 thereof as shown in FIG. 10B.

Figure 31:
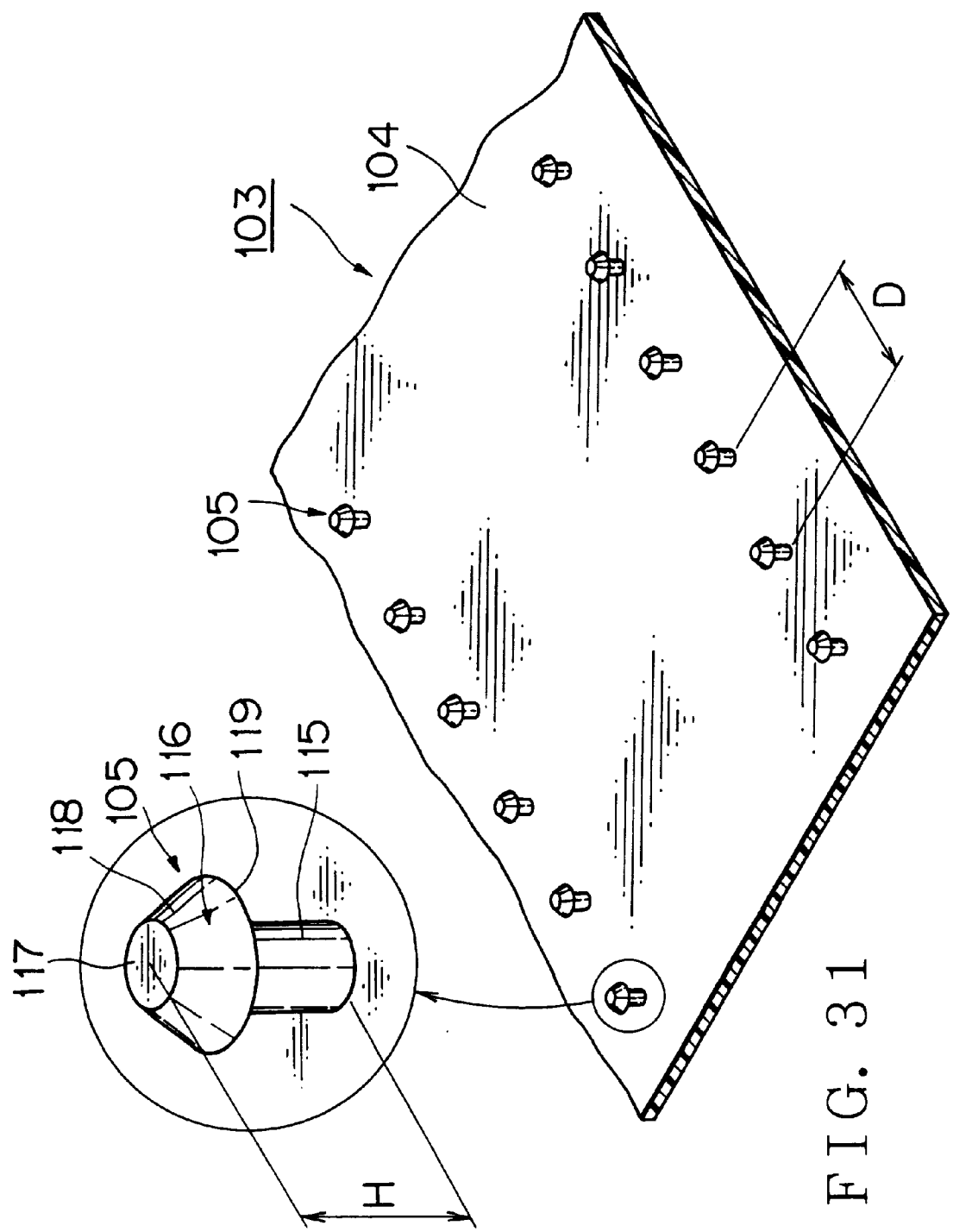
FIG. 31 is an enlarged perspective view showing an opposing wall of FIG. 28.

As shown in FIG. 31, the wall 104 of the panel 103 is, for example, a wall of an instrument panel (see the numeral 152 in FIG. 21) mounted on an automobile vehicle or a wall of a vehicle body. The wall 104 has the plurality of locking projections 105.

The locking projection 105 consists of a projecting main body 115 extending from the wall 104 and a conical latch portion 116 formed in a fore end of the projecting main body 115. The plurality of locking projections 105 are disposed in a line so as to be equally spaced from one another with a distance D. The projection main body 115 has a flat foremost face 117. The projecting length (height) H of the locking projection 105 is almost the same as the depth h (see FIG. 30A) of the through hole 102. In this embodiment, the projecting length (height) H of the locking projection 105 is almost equal to the thickness of the insulator layer 111. The latch portion 116 has a tapered surface 118 and a stopper surface 119.

As shown in FIG. 33, the tapered surface 118 enables the locking projection 105 to be smoothly inserted into the through hole 102. The stopper face 119 abuts against a lock face 120 of the stepped portion 113 to engage the locking projection 105 with the through hole 102. The Locking projection 105 may be formed on the wall 104 of an instrument panel integrally with the instrument panel when molded.

Figure 32:
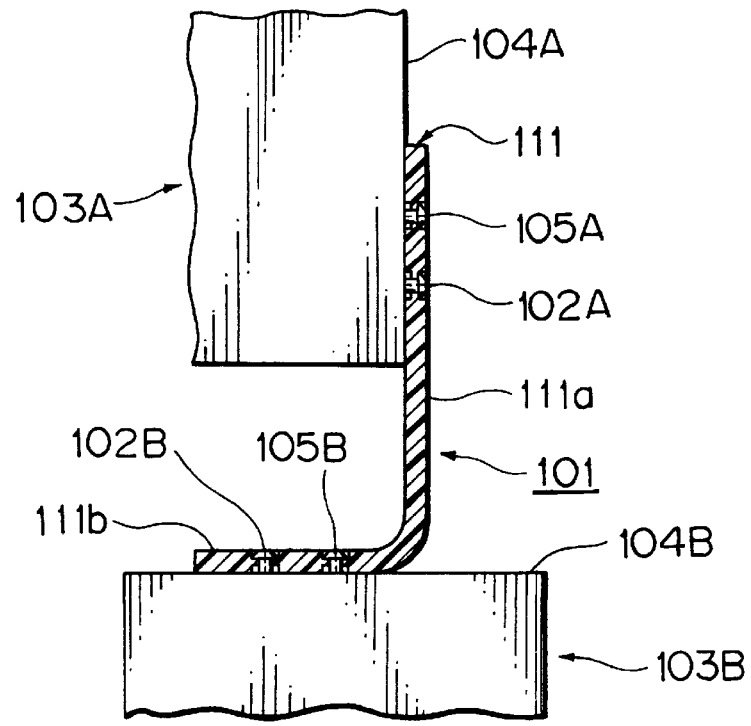
FIG. 32 is a sectional view showing a state where the wiring substrate has been mounted on opposing walls.

The distance D between two adjacent locking projections 105 is n (an integer) times of the distance d between two adjacent through holes (D=nd). That is, as shown in FIG. 32, each projection 105 is disposed to engage with one of the through holes 102. Only pushing the wiring substrate 101 against the wall 104 enables the engagement of the wiring substrate 101 with the opposing panel 103.

Differed from the prior art, the above-mentioned construction of locking projections 105 and the through holes 102 requires no other fixing members on mounting the wiring substrate 101 on the wall 104 of the panel 103, which minimizes the number of parts for the mounting. This requires no preparatory steps for fitting the wiring substrate 101 on the wall 104, which minimizes the mounting steps to provide an increased workability in the assembling process thereof.

Next, referring to FIG. 28, a process (steps) for mounting the wiring substrate 101 on a first panel 103A and a second panel 103B will be discussed.

As shown in FIG. 28, each wall surface 104A, 104B of the first and second panels 103A, 103B is preparatorily formed with locking projections 105A, 105B arranged for mounting the wiring substrate 101. The wiring substrate 101 is bent to align the through holes 102 with the associated projections 105. Pushing the wiring substrate 101 toward each wall surface 104A, 104B simultaneously or successively causes the locking projections 105A of the first panel 103A to engage with through holes 102A in the upper surface 111a of the insulator layer 111 and causes the locking projections 105B of the second panel 103B to engage with through holes 102B in the bottom surface 111b of the insulator layer 111 as illustrated in FIG. 32. This allows the wiring substrate 101 to be secured to the first and second panels 103A, 103B with a single step. The through hole 102 can receive the entire length of the locking projection 105 so that each surface 111a, 111b of the insulator layer 111 becomes flat after the mounting (fixing) of the wiring substrate 101.

The through hole 102 opened in both the surface 111a, 111b of the insulator layer 111 allows insertion of the locking projection 105 from either side of the insulator layer 111. Thus, this construction is more efficient on securing the wiring substrate 101 to the first and second panels 103A, 103B than a conventional securing method. Particularly, the construction is advantageous for securing the wiring substrate 101 to the first and second panels 3A, 3B which are positioned in a blind space. The conical latch portion 116 of the projection 105 allows the engagement of the locking projection 105 with the through hole 102 even when the wiring substrate 101 is positioned not to be correctly perpendicular to the locking projection 105. This improves the mounting step of the wiring substrate 101 in workability.

In the aforementioned embodiment, as shown in FIG. 28, the projection 105 and the through hole 102 are applied to secure the wiring substrate 101 to the panel 103. However, another similar securing means may be utilized in place of the projection 105 and the through hole 102.

What is claimed is:

1. A wiring substrate comprising:

a coating insulator layer, a plurality of conductors disposed in parallel with one another longitudinally in said coating insulator layer, plural rows of through holes disposed longitudinally in said coating insulator layer, each through hole not interfering with said conductors, and plural rows of locking projections longitudinally formed on a face of said coating insulator layer, wherein said locking projections are spaced from one another equally to the space of the rows of said through holes and said locking projection has a construction to be engageable with said through hole.

2. The wiring substrate set forth in claim 1, wherein one row of said through holes are in line with one row of said locking projections.

3. The wiring substrate set forth in claim 2, said one row of through holes and said one row of locking projections are disposed in each outer side of said conductors, said through holes and locking projections in one side of said insulator layer being positioned in a symmetrical relation with the other.

4. The wiring substrate set forth in claim 2, wherein said plural locking projections are disposed at regular intervals and each row of said through holes is disposed between adjacent two of said plural locking projections.

5. The wiring substrate set forth in claim 1, wherein said through holes are disposed at regular intervals and said locking projection is disposed in the middle of the interval of said through holes.

6. The wiring substrate set forth in claim 1, wherein said insulator layer has at least one connection portion for connecting one of said conductors to an external circuit.

7. The wiring substrate set forth in claim 6, wherein said connection portion is a recess formed in a surface of said coating insulator layer for having a thinner insulating thickness from the one of said conductors.

8. The wiring substrate set forth in claim 6, wherein said connection portion is formed so as to expose said conductors from said coating insulator layer.

9. The wiring substrate set forth in claim 6, wherein said connection portion is elongated in a direction intersecting the longitudinal direction of said conductors.

10. The wiring substrate set forth in claim 9, wherein said coating insulator layer has a plurality of said connection portions disposed in the lateral direction of the said conductors for every other one of said conductors.

11. The wiring substrate set forth in claim 1, wherein said coating insulator layer has a thickness equal to the height of said locking projection.

12. The wiring substrate set forth in claim 1, wherein said coating insulator layer is made of an elastomer material and said conductors are integrally inserted in said coating insulator layer.

13. The wiring substrate set forth in claim 1, wherein a plurality of said wiring substrates can be layered such that at least one of said through holes provided in one of said wiring substrates engages with one of said locking projections provided on another of said wiring substrates adjacent to the one of said wiring substrates.

14. A wiring substrate comprising an insulator layer and a plurality of conductors disposed in said insulator layer in parallel with one another, wherein said wiring substrate is enough flexible to be arranged along a structural wall for wiring.

15. A wiring substrate comprising an insulator layer, a plurality of parallel conductors disposed in said insulator layer, and a stiffener disposed in said insulator layer, wherein said stiffener is positioned not to interfere with said conductors and provides enough stiffness to keep said wiring substrate in a desired shape.

16. The wiring substrate as set forth in claim 15, wherein said stiffener has a larger bending strength than said insulator layer and said stiffener means is disposed in parallel with the longitudinal direction of said conductors.

17. The wiring substrate as set forth in claim 16, wherein said stiffener is positioned each outside of said conductors.

18. The wiring substrate as set forth in claim 14, wherein said insulator layer is made of an elastomer in which said conductors are inserted.

19. The wiring substrate as set forth in claim 14, wherein said wiring substrate has a plurality of through holes each of which is engageable with a locking projection provided on a wall of another structure.

20. The wiring substrate as set forth in claim 19, wherein said through holes are equally spaced from one another.

21. The wiring substrate as set forth in claim 19, wherein said through holes has at least one lock portion for locking said locking projection.

* * * * *